(12) United States Patent
Kim et al.

(10) Patent No.: US 9,362,486 B2
(45) Date of Patent: Jun. 7, 2016

(54) MAGNETIC MEMORY DEVICE HAVING PERPENDICULAR MAGNETIC TUNNEL JUNCTION PATTERN AND METHOD OF FORMING THE SAME

(71) Applicants: KeeWon Kim, Suwon-si (KR); SangHwan Park, Hwaseong-si (KR); JaeHoon Kim, Seoul (KR)

(72) Inventors: KeeWon Kim, Suwon-si (KR); SangHwan Park, Hwaseong-si (KR); JaeHoon Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/686,761

(22) Filed: Apr. 14, 2015

(65) Prior Publication Data

US 2016/0093798 A1 Mar. 31, 2016

(30) Foreign Application Priority Data

Sep. 29, 2014 (KR) .................. 10-2014-0130491

(51) Int. Cl.
*H01L 43/08* (2006.01)
*H01L 43/02* (2006.01)
*G11C 11/16* (2006.01)

(52) U.S. Cl.
CPC .............. *H01L 43/08* (2013.01); *G11C 11/161* (2013.01); *H01L 43/02* (2013.01)

(58) Field of Classification Search
CPC ............................. H01L 43/08; G11C 11/161
See application file for complete search history.

(56) References Cited

U.S. PATENT DOCUMENTS

| | | | | |
|---|---|---|---|---|
| 7,283,333 B2 * | 10/2007 | Gill | ........................ | B82Y 25/00 360/324.1 |
| 8,063,459 B2 * | 11/2011 | Ranjan | .................... | B82Y 25/00 257/421 |
| 8,445,979 B2 * | 5/2013 | Oh | ........................ | B82Y 25/00 257/421 |
| 8,692,342 B2 * | 4/2014 | Oh | ........................ | H01L 43/08 257/108 |
| 8,836,056 B2 * | 9/2014 | Oguz | ...................... | H01L 43/12 257/295 |
| 9,024,398 B2 * | 5/2015 | Gan | ........................ | H01L 43/08 257/421 |
| 9,184,376 B2 | 11/2015 | Park et al. | | |
| 2008/0246104 A1 * | 10/2008 | Ranjan | ............... | G11C 11/5607 257/421 |
| 2014/0103472 A1 * | 4/2014 | Kent | ...................... | G11C 11/16 257/421 |
| 2014/0291788 A1 * | 10/2014 | Zimmer | .................. | H01L 43/08 257/421 |
| 2015/0118520 A1 * | 4/2015 | Ahn | ........................ | G11B 5/332 428/815 |
| 2015/0129997 A1 * | 5/2015 | Tang | ...................... | H01L 43/12 257/427 |

FOREIGN PATENT DOCUMENTS

KR 20150066858 A 6/2015

* cited by examiner

*Primary Examiner* — William Coleman
(74) *Attorney, Agent, or Firm* — Renaissance IP Law Group LLP

(57) ABSTRACT

Provided are a magnetic memory device and a method of forming the same. The magnetic memory device includes a pinned pattern including a coupling enhancement pattern, a polarization enhancement pattern, and a texture blocking pattern located between the coupling enhancement pattern and the polarization enhancement pattern, a free pattern located on the polarization enhancement pattern of the pinned pattern, and a tunnel barrier located between the pinned pattern and the free pattern. The coupling enhancement pattern includes a first enhancement magnetic pattern, a second enhancement magnetic pattern, and a first enhancement nonmagnetic pattern located between the first enhancement magnetic pattern and the second enhancement magnetic pattern.

19 Claims, 33 Drawing Sheets

MAGNETIC MEMORY DEVICE HAVING PERPENDICULAR MAGNETIC TUNNEL JUNCTION PATTERN AND METHOD OF FORMING THE SAME

CROSS-REFERENCE TO RELATED APPLICATION

This application claims priority under 35 U.S.C. §119 to Korean Patent Application No. 10-2014-0130491 filed on Sep. 29, 2014, the disclosure of which is hereby incorporated by reference in its entirety.

BACKGROUND

1. Field

Embodiments relate to a magnetic memory device having a perpendicular magnetic tunnel junction pattern which utilizes a synthetic anti-ferromagnetic (SAF) structure, and a method of forming the same.

2. Description of Related Art

A magnetic memory device includes a magnetic tunnel junction pattern. The magnetic tunnel junction pattern may include a synthetic anti-ferromagnetic (SAF) structure. For example, the magnetic tunnel junction pattern may include a first pinned pattern, a spacer, a second pinned pattern, a tunnel barrier, and a free pattern, which are stacked in a vertical direction. A method of forming the magnetic memory device may include an annealing process and a curing process. In the magnetic memory device, various studies are being conducted to perform a high temperature process without degradation of an electromagnetic characteristic of the magnetic tunnel junction pattern.

SUMMARY

An embodiment includes a magnetic memory device, comprising: a pinned pattern including a coupling enhancement pattern, a polarization enhancement pattern, and a texture blocking pattern disposed between the coupling enhancement pattern and the polarization enhancement pattern; a free pattern disposed on the polarization enhancement pattern of the pinned pattern; and a tunnel barrier disposed between the pinned pattern and the free pattern. The coupling enhancement pattern comprises a first enhancement magnetic pattern, a second enhancement magnetic pattern, and a first enhancement non-magnetic pattern disposed between the first enhancement magnetic pattern and the second enhancement magnetic pattern.

An embodiment includes a magnetic memory device, comprising: a first pinned pattern; a free pattern disposed on the first pinned pattern; a spacer disposed between the first pinned pattern and the free pattern; a first tunnel barrier disposed between the spacer and the free pattern; a coupling enhancement pattern disposed between the spacer and the first tunnel barrier; a polarization enhancement pattern disposed between the coupling enhancement pattern and the first tunnel barrier; and a texture blocking pattern disposed between the coupling enhancement pattern and the polarization enhancement pattern. The coupling enhancement pattern comprises at least two interfaces disposed between a magnetic material layer and a non-magnetic material layer.

An embodiment includes a magnetic memory device, comprising: a pinned pattern including a plurality of patterns; a tunnel barrier pattern disposed on the pinned pattern; and a free pattern disposed on the pinned pattern. Each of at least two interfaces between the patterns of the pinned pattern comprises a magnetic material to non-magnetic material interface.

BRIEF DESCRIPTION OF THE DRAWINGS

The foregoing and other features and advantages will be apparent from the more particular description of particular embodiments, as illustrated in the accompanying drawings in which like reference characters refer to the same parts throughout the different views. The drawings are not necessarily to scale. In the drawings.

DETAILED DESCRIPTION OF THE EMBODIMENTS

Figure 1:
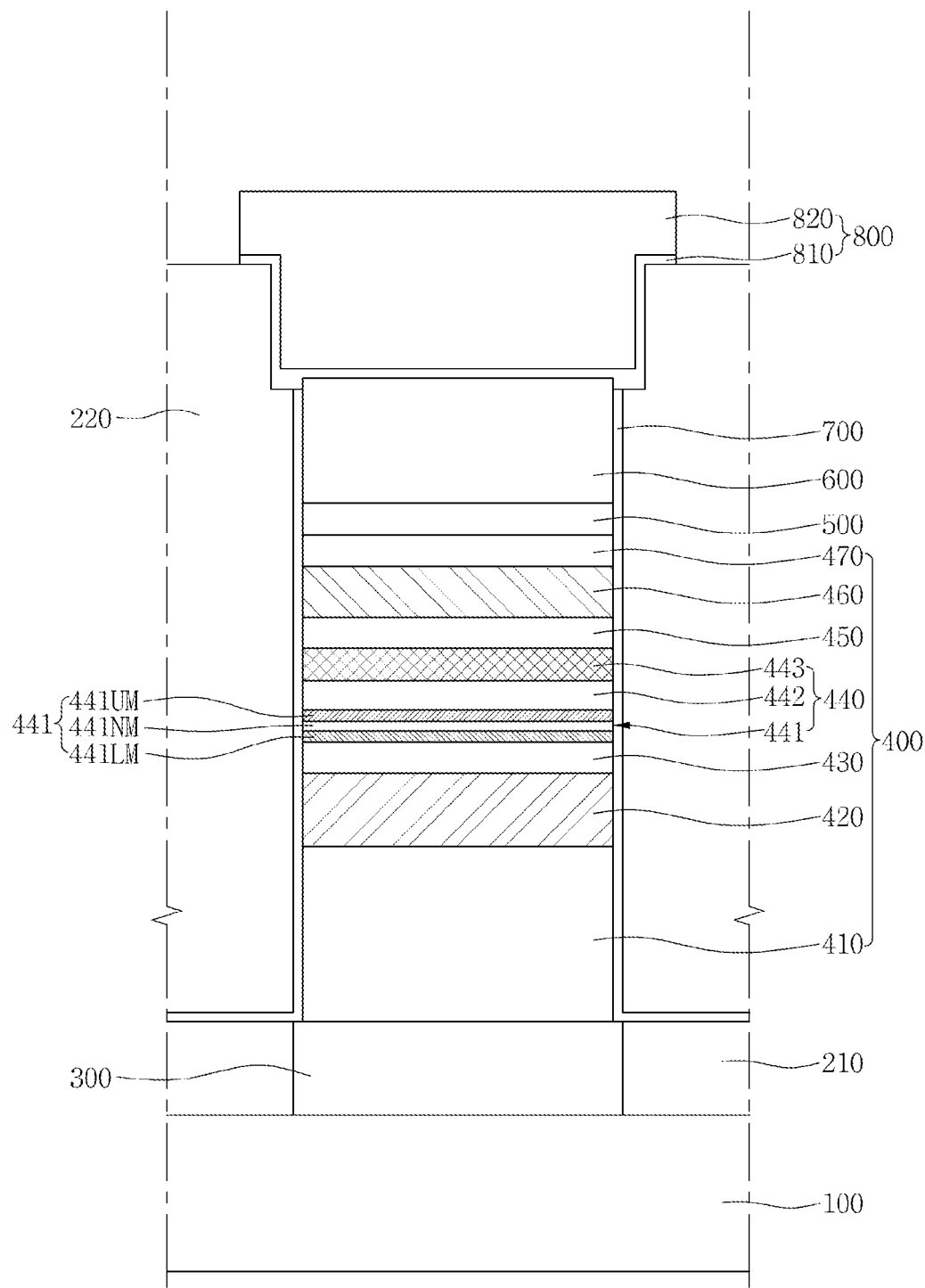
FIG. 1 is a schematic cross-sectional view showing a magnetic memory device in accordance with an embodiment.

Purposes, technical configurations, and operational effects will be more clearly described in detail with reference to the accompanying drawings which illustrate particular embodiments. The embodiments are provided in order to fully convey the technological scope to those skilled in the art. However, embodiments may take different forms and should not be construed as limited to the particular embodiments set forth herein.

Throughout this specification, like numerals refer to like elements. In the drawings, the lengths and thicknesses of layers and regions may be exaggerated for clarity. In addition, it will be understood that when a first element is referred to as being "on" a second element, the first element may be directly on the second element, or a third element may be interposed between the first element and the second element.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

In addition, unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, substantially the same may include variations such that two entities that are substantially the same may, but need not be identical, but are sufficiently equivalent in a particular aspect. For example, two surfaces may be at substantially the same level if variations between the levels of the surfaces are within process variations. In another example, two materials may have substantially the same crystal structure even though some imperfections and/or differences are present due to process variations.

Embodiments

FIG. 1 is a schematic cross-sectional view showing a magnetic memory device in accordance with an embodiment. Referring to FIG. 1, the magnetic memory device in accordance with the embodiment may include a substrate 100, a lower interlayer insulating layer 210, an upper interlayer insulating layer 220, a lower plug 300, a magnetic tunnel junction pattern 400, a capping pattern 500, and an upper electrode 800.

The substrate 100 may include a semiconductor substrate. The lower interlayer insulating layer 210 may be located on the substrate 100. The lower interlayer insulating layer 210 may include an insulating material. For example, the lower interlayer insulating layer 210 may include silicon oxide, silicon nitride, or the like.

The lower plug 300 may be surrounded by the lower interlayer insulating layer 210. A level of an upper surface of the lower plug 300 may be substantially the same as that of an upper surface of the lower interlayer insulating layer 210. The lower plug 300 may include a conductive material. For example, the lower plug 300 may include a metal.

The magnetic tunnel junction pattern 400 may be located on the lower plug 300. The magnetic tunnel junction pattern 400 may include a synthetic anti-ferromagnetic (SAF) structure. For example, the magnetic tunnel junction pattern 400 may include a seed pattern 410, a lower pinned pattern 420, a spacer 430, an upper pinned pattern 440, a first tunnel barrier 450, a free pattern 460, and a second tunnel barrier 470.

The seed pattern 410 may be located near the lower plug 300. The seed pattern 410 may directly contact the lower plug 300. The seed pattern 410 may have a predetermined crystal structure. For example, the seed pattern 410 may include Ru, Ta, or Ti.

The lower pinned pattern 420 may be located on the seed pattern 410. The lower pinned pattern 420 may directly contact the seed pattern 410. A crystal structure of the lower pinned pattern 420 may be affected by the seed pattern 410. For example, the lower pinned pattern 420 may have substantially the same crystal structure as the seed pattern 410.

The lower pinned pattern 420 may include a magnetic material. A magnetization direction of the lower pinned pattern 420 may be perpendicular to an upper surface of the substrate 100. The lower pinned pattern 420 may have a vertical magnetization characteristic. For example, the lower pinned pattern 420 may include at least one of Co, Fe, and Ni, and one of Pt, Pd, Ru, and Ta. In a particular embodiment, the lower pinned pattern 420 may have a multi-layer structure.

The magnetization direction of the lower pinned pattern 420 may be fixed. The magnetization direction of the lower pinned pattern 420 may not be affected by an external magnetic field. The magnetization direction of the lower pinned pattern 420 may not be changed by a magnetic field formed between the lower plug 300 and the upper electrode 800.

The spacer 430 may be located on the lower pinned pattern 420. The spacer 430 may directly contact the lower pinned pattern 420. The spacer 430 may have a predetermined crystal structure. For example, the spacer 430 may include Ru, Ir, Re, or Os. A crystal structure of the spacer 430 may be a hexagonal close-packed lattice (HCP) or a face centered cubic lattice (FCC).

The upper pinned pattern 440 may be located on the spacer 430. The upper pinned pattern 440 may include a coupling enhancement pattern 441, a texture blocking pattern 442, and a polarization enhancement pattern 443.

The coupling enhancement pattern 441 may be disposed near the spacer 430. The coupling enhancement pattern 441 may include a lower enhancement magnetic pattern 441LM, an enhancement non-magnetic pattern 441NM, and an upper enhancement magnetic pattern 441UM.

The lower enhancement magnetic pattern 441LM may be located close to the spacer 430. The lower enhancement magnetic pattern 441LM may directly contact the spacer 430.

The lower enhancement magnetic pattern 441LM may include a magnetic material. A magnetization direction of the lower enhancement magnetic pattern 441LM may be perpendicular to the upper surface of the substrate 100. The lower enhancement magnetic pattern 441LM may have a vertical magnetization characteristic. For example, the lower enhancement magnetic pattern 441LM may include Co.

A crystal structure of the lower enhancement magnetic pattern 441LM may be affected by the spacer 430. The crystal structure of the lower enhancement magnetic pattern 441LM may be a HCP or a FCC. For example, the lower enhancement magnetic pattern 441LM may have substantially the same crystal structure as the spacer 430.

The enhancement non-magnetic pattern 441NM may enhance the vertical magnetization characteristic of the lower enhancement magnetic pattern 441LM. The enhancement non-magnetic pattern 441NM may be located on the lower enhancement magnetic pattern 441LM. The enhancement non-magnetic pattern 441NM may directly contact the lower enhancement magnetic pattern 441LM.

The enhancement non-magnetic pattern 441NM may include a non-magnetic material. A crystal structure of the enhancement non-magnetic pattern 441NM may be a HCP or a FCC. For example, the enhancement non-magnetic pattern 441NM may have substantially the same crystal structure as the lower enhancement magnetic pattern 441LM. For example, the enhancement non-magnetic pattern 441NM may include Pt, Pd, or Ir.

The upper enhancement magnetic pattern 441UM may be located on the enhancement non-magnetic pattern 441NM. The upper enhancement magnetic pattern 441UM may directly contact the enhancement non-magnetic pattern 441NM.

The upper enhancement magnetic pattern 441UM may include a magnetic material. The upper enhancement magnetic pattern 441UM may have substantially the same magnetization direction as the lower enhancement magnetic pattern 441LM. The magnetization direction of the upper enhancement magnetic pattern 441UM may be perpendicular to the upper surface of the substrate 100. The upper enhancement magnetic pattern 441UM may have a vertical magnetization characteristic.

A crystal structure of the upper enhancement magnetic pattern 441UM may be a HCP or a FCC. For example, the upper enhancement magnetic pattern 441UM may have substantially the same crystal structure as the lower enhancement magnetic pattern 441LM. For example, the upper enhancement magnetic pattern 441UM may include Co. The vertical magnetization characteristic of the upper enhancement magnetic pattern 441UM may be enhanced by the enhancement non-magnetic pattern 441NM.

In the magnetic memory device in accordance with the embodiment, the coupling enhancement pattern 441 of the upper pinned pattern 440 may include two interfaces. The interfaces each may be located between the enhancement magnetic patterns 441LM and 441UM including a magnetic material and the enhancement non-magnetic pattern 441NM including a non-magnetic material. Thus, in the magnetic memory device in accordance with the embodiment, the vertical magnetization characteristics of the enhancement magnetic patterns 441LM and 441UM may be enhanced by the enhancement non-magnetic pattern 441NM. That is, in the magnetic memory device in accordance with the embodiment, a vertical magnetization characteristic of the upper pinned pattern 440 may be enhanced by an increase of the number of interfaces between a magnetic material layer and a non-magnetic material layer. Thus, in the magnetic memory device in accordance with the embodiment, an exchange coupling force of the magnetic tunnel junction pattern may be improved. Therefore, in the magnetic memory device in accordance with the embodiment, an electromagnetic characteristic of the magnetic tunnel junction pattern may be stably maintained even after a high temperature process.

The texture blocking pattern 442 may be located on the coupling enhancement pattern 441. The texture blocking pattern 442 may directly contact the upper enhancement magnetic pattern 441UM.

The texture blocking pattern 442 may include a magnetic material and an amorphization material. For example, the texture blocking pattern 442 may include at least one of Co, Fe, and Ni, and one of B, Si, Zr, Hf, Be, Al, C, Mo, Ta, and Cu. For example, the texture blocking pattern 442 may be amorphous.

The polarization enhancement pattern 443 may be located on the texture blocking pattern 442. The polarization enhancement pattern 443 may directly contact the texture blocking pattern 442. The polarization enhancement pattern 443 may have a crystal structure different from the upper enhancement magnetic pattern 441UM.

The polarization enhancement pattern 443 may include a magnetic material. A magnetization direction of the polarization enhancement pattern 443 may be perpendicular to the upper surface of the substrate 100. The polarization enhancement pattern 443 may have a vertical magnetization characteristic.

The polarization enhancement pattern 443 may further include an amorphization material. For example, the polarization enhancement pattern 443 may include at least one of Co, Fe, and Ni, and one of B, Si, Zr, Hf, Be, Al, C, Mo, Ta, and Cu. For example, the polarization enhancement pattern 443 may include substantially the same material as the texture blocking pattern 442. Content of an amorphization material in the polarization enhancement pattern 443 may be lower than that of an amorphization material in the texture blocking pattern 442. For example, a crystallization temperature of the polarization enhancement pattern 443 may be lower than that of the texture blocking pattern 442.

The magnetization direction of the polarization enhancement pattern 443 may be fixed. The magnetization direction of the polarization enhancement pattern 443 may not be affected by an external magnetic field. The magnetization direction of the polarization enhancement pattern 443 may not be changed by a magnetic field formed between the lower plug 300 and the upper electrode 800.

The first tunnel barrier 450 may be located on the polarization enhancement pattern 443. The first tunnel barrier 450 may direct contact the polarization enhancement pattern 443. The first tunnel barrier 450 may affect a crystal structure of the polarization enhancement pattern 443. For example, the polarization enhancement pattern 443 may have substantially the same crystal structure as the first tunnel barrier 450.

The first tunnel barrier 450 may include a non-magnetic material. For example, the first tunnel barrier 450 may include MgO.

The free pattern 460 may be located on the first tunnel barrier 450. The free pattern 460 may directly contact the first tunnel barrier 450. A crystal structure of the free pattern 460 may be affected by the first tunnel barrier 450. For example, the free pattern 460 may have substantially the same crystal structure as the first tunnel barrier 450.

The free pattern 460 may include a magnetic material. A magnetization direction of the free pattern 460 may be perpendicular to the upper surface of the substrate 100. The free pattern 460 may have a vertical magnetization characteristic.

The free pattern 460 may further include an amorphization material. For example, the free pattern 460 may include at least one of Co, Fe, and Ni, and one of B, Si, Zr, Hf, Be, Al, C, Mo, Ta, and Cu. A crystallization temperature of the free pattern 460 may be lower than that of the texture blocking pattern 442. For example, content of an amorphization material in the free pattern 460 may be lower than that of an amorphization material in the texture blocking pattern 442. For example, the crystallization temperature of the free pattern 460 may be substantially the same as that of the polarization enhancement pattern 443.

The magnetization direction of the free pattern 460 may not be fixed. The magnetization direction of the free pattern 460 may be affected by an external magnetic field. For example, the magnetization direction of the free pattern 460 may be changed by a magnetic field formed between the lower plug 300 and the upper electrode 800.

The second tunnel bather 470 may be located on the free pattern 460. The second tunnel bather 470 may directly contact the free pattern 460. The second tunnel barrier 470 may affect the crystal structure of the free pattern 460. For example, the second tunnel barrier 470 may have substantially the same crystal structure as the first tunnel barrier 450.

The second tunnel bather 470 may include a non-magnetic material. The second tunnel barrier 470 may include substantially the same material as the first tunnel barrier 450. For example, the second tunnel barrier 470 may include MgO.

The capping pattern 500 may be located on the magnetic tunnel junction pattern 400. The capping pattern 500 may directly contact the second tunnel barrier 470 of the magnetic tunnel junction pattern 400. For example, the capping pattern 500 may include one of Ta, Al, Cu, Au, Ti, TaN, and TiN. For example, the capping pattern 500 may have a multi-layer structure.

The upper electrode 800 may be located on the capping pattern 500. The upper electrode 800 may include an electrode barrier 810 and an upper conductive pattern 820. The upper conductive pattern 820 may be located on the electrode barrier 810. The electrode barrier 810 and the upper conductive pattern 820 each may include a conductive material. For example, the electrode barrier 810 may include a metal nitride, and the upper conductive pattern 820 may include a metal.

The upper interlayer insulating layer 220 may be located on the lower interlayer insulating layer 210. The upper interlayer insulating layer 220 may surround the magnetic tunnel junction pattern 400 and the capping pattern 500. The upper interlayer insulating layer 220 may partially surround the upper electrode 800. For example, a level of an upper surface of the upper interlayer insulating layer 220 may be lower than that of an upper surface of the upper electrode 800. The electrode barrier 810 may be located between the upper interlayer insulating layer 220 and the upper conductive pattern 820.

The upper interlayer insulating layer 220 may include an insulating material. For example, the upper interlayer insulating layer 220 may include silicon oxide or silicon nitride. The upper interlayer insulating layer 220 may include substantially the same material as the lower interlayer insulating layer 210.

The magnetic memory device in accordance with the embodiment may further include a metal pattern 600 and a side insulating layer 700.

The metal pattern 600 may be located between the capping pattern 500 and the upper electrode 800. The metal pattern 600 may directly contact the capping pattern 500. The upper electrode 800 may directly contact the metal pattern 600. The metal pattern 600 may include a conductive material. For example, the metal pattern 600 may include a metal nitride or a metal.

The side insulating layer 700 may be located on a side surface of the magnetic tunnel junction pattern 400, a side surface of the capping pattern 500, and a side surface of the metal pattern 600. The side insulating layer 700 may be located between the magnetic tunnel junction pattern 400, the capping pattern 500, and the metal pattern 600, and the upper interlayer insulating layer 220. The side insulating layer 700 may extend between the upper interlayer insulating layer 220 and the lower interlayer insulating layer 210. The side insulating layer 700 may include an insulating material. For example, the side insulating layer 700 may include silicon nitride, silicon oxide, or a metal oxide.

As a result, in the magnetic memory device in accordance with the embodiment, an electromagnetic characteristic of the magnetic tunnel junction pattern may be stably maintained even after a high temperature process. Therefore, in the magnetic memory device in accordance with the embodiment, reliability of the device may be improved.

Figure 2:
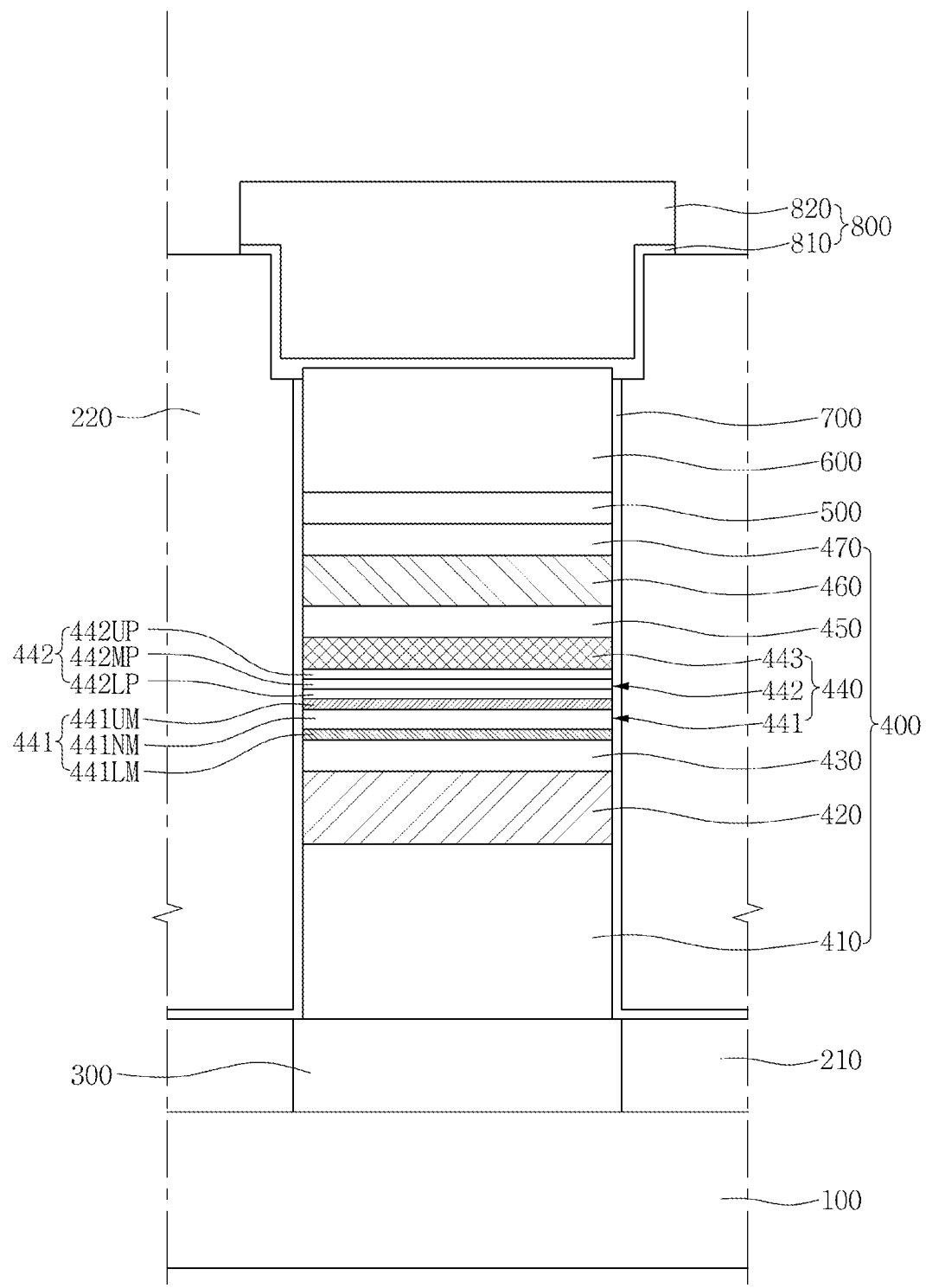
FIG. 2 is a schematic cross-sectional view showing a magnetic memory device in accordance with another embodiment.

FIG. 2 is a schematic cross-sectional view showing a magnetic memory device in accordance with another embodiment. Referring FIG. 2, the magnetic memory device in accordance with the embodiment may include a substrate 100, a lower interlayer insulating layer 210, an upper interlayer insulating layer 220, a lower plug 300, a magnetic tunnel junction pattern 400, a capping pattern 500, a metal pattern 600, a side insulating layer 700 and an upper electrode 800 similar to the magnetic memory device of FIG. 1.

The magnetic tunnel junction pattern 400 may include a seed pattern 410, a lower pinned pattern 420, a spacer 430, an upper pinned pattern 440, a first tunnel barrier 450, a free pattern 460, and a second tunnel barrier 470. The upper pinned pattern 440 may include a coupling enhancement pattern 441, a texture blocking pattern 442, and a polarization enhancement pattern 443.

The coupling enhancement pattern 441 may include a lower enhancement magnetic pattern 441LM, an enhancement non-magnetic pattern 441NM, and an upper enhancement magnetic pattern 441UM. The enhancement non-magnetic pattern 441NM may be thicker than the lower enhancement magnetic pattern 441LM and the upper enhancement magnetic pattern 441UM.

In this embodiment, the texture blocking pattern 442 may include a lower blocking non-magnetic pattern 442LP, a blocking magnetic pattern 442MP, and an upper blocking non-magnetic pattern 442UP.

The lower blocking non-magnetic pattern 442LP may be located close to the coupling enhancement pattern 441. The lower blocking non-magnetic pattern 442LP may directly contact the upper enhancement magnetic pattern 441UM.

The lower blocking non-magnetic pattern 442LP may include a non-magnetic material. For example, the lower blocking non-magnetic pattern 442LP may include Ta, W, Hf, Nb, Mo, Ti, Re, Os, Tc, or Nd.

The upper blocking non-magnetic pattern 442UP may be located close to the polarization enhancement pattern 443. The upper blocking non-magnetic pattern 442UP may directly contact the polarization enhancement pattern 443.

The upper blocking non-magnetic pattern 442UP may include a non-magnetic material. The upper blocking non-magnetic pattern 442UP may include Ta, W, Hf, Nb, Mo, Ti, Re, Os, Tc, or Nd. For example, the upper blocking non-magnetic pattern 442UP may include substantially the same material as the lower blocking non-magnetic pattern 442LP.

The blocking magnetic pattern 442MP may be located between the lower blocking non-magnetic pattern 442LP and the upper blocking non-magnetic pattern 442UP. The blocking magnetic pattern 442MP may directly contact the lower blocking non-magnetic pattern 442LP. The blocking magnetic pattern 442MP may directly contact the upper blocking non-magnetic pattern 442UP.

The blocking magnetic pattern 442MP may include a magnetic material. The blocking magnetic pattern 442MP may include an amorphization material. For example, the blocking magnetic pattern 442MP may include at least one of Co, Fe, and Ni, and one of B, Si, Zr, Hf, Be, Al, C, Mo, Ta, and Cu.

A crystallization temperature of the blocking magnetic pattern 442MP may be higher than that of the polarization enhancement pattern 443. For example, content of an amorphization material in the blocking magnetic pattern 442MP may be higher than that of an amorphization material in the polarization enhancement pattern 443. For example, the blocking magnetic pattern 442MP may be amorphous.

Figure 3:
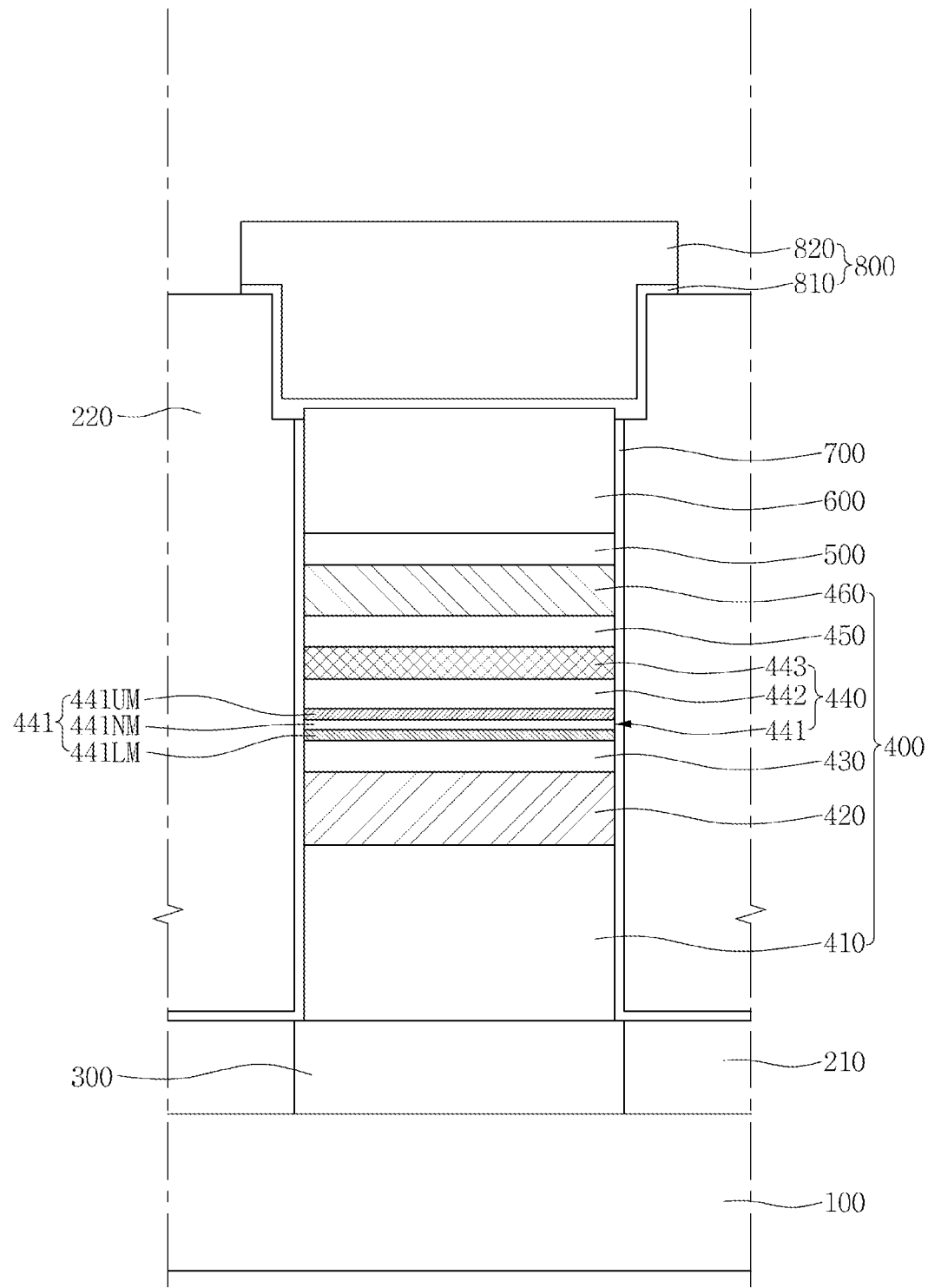
FIG. 3 is a schematic cross-sectional view showing a magnetic memory device in accordance with still another embodiment.

FIG. 3 is a schematic cross-sectional view showing a magnetic memory device in accordance with still another embodiment. Referring to FIG. 3, the magnetic memory device in accordance with the embodiment may include a substrate 100, a lower interlayer insulating layer 210, an upper interlayer insulating layer 220, a lower plug 300, a magnetic tunnel junction pattern 400, a capping pattern 500, a metal pattern 600, a side insulating layer 700, and an upper electrode 800 similar to the magnetic memory device FIG. 1.

The magnetic tunnel junction pattern 400 may include a seed pattern 410, a lower pinned pattern 420, a spacer 430, an upper pinned pattern 440, a first tunnel barrier 450, and a free pattern 460. However, the magnetic tunnel junction pattern 400 does not include a second tunnel barrier 470. The capping pattern 500 may directly contact the free pattern 460 of the magnetic tunnel junction pattern 400.

The upper pinned pattern 440 may include a coupling enhancement pattern 441, a texture blocking pattern 442, and a polarization enhancement pattern 443. The coupling enhancement pattern 441 may include a lower enhancement magnetic pattern 441LM, an enhancement non-magnetic pattern 441NM, and an upper enhancement magnetic pattern 441UM.

Figure 4:
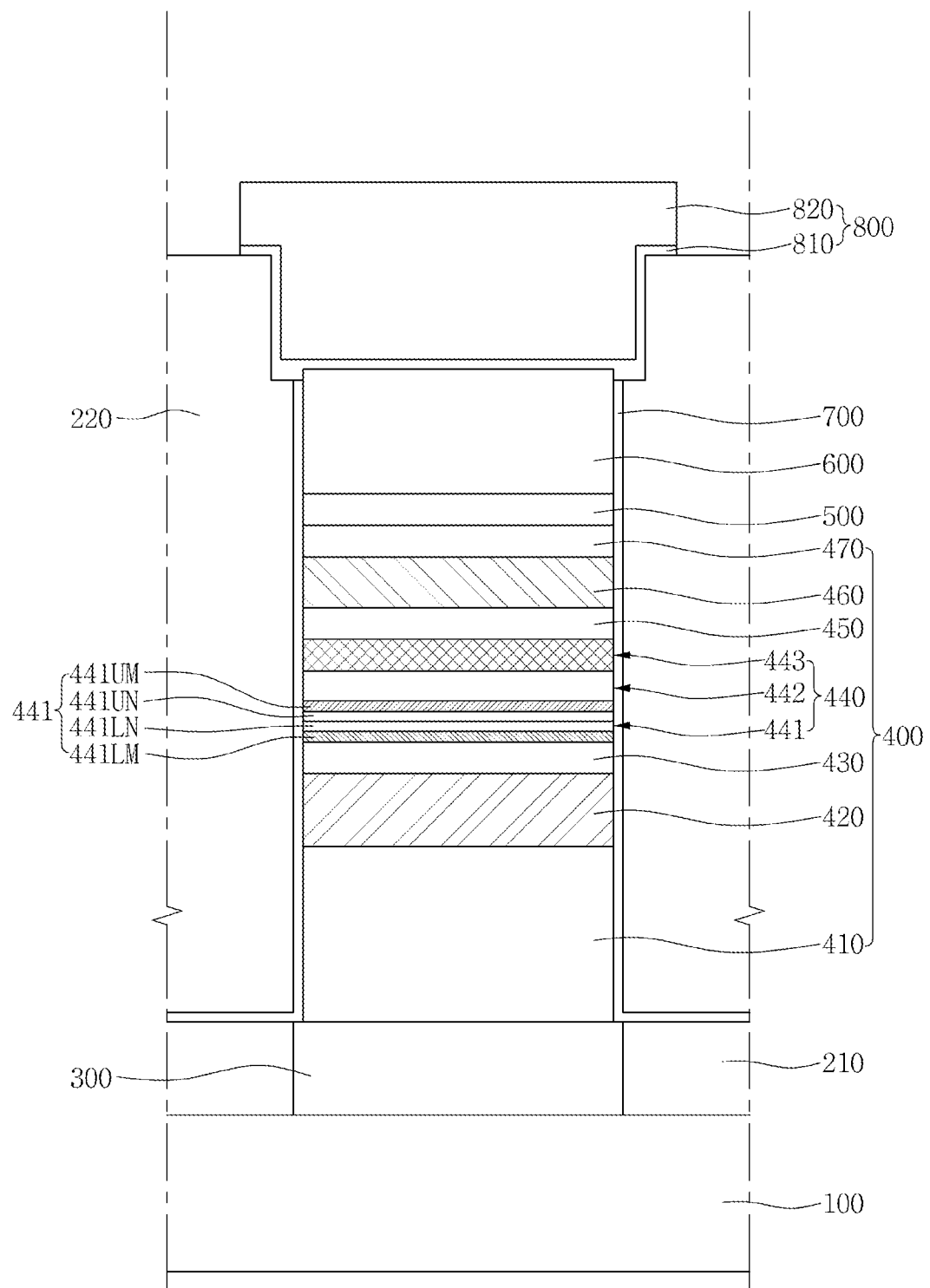
FIG. 4 is a schematic cross-sectional view showing a magnetic memory device in accordance with yet another embodiment.

FIG. 4 is a schematic cross-sectional view showing a magnetic memory device in accordance with yet another embodiment. Referring to FIG. 4, the magnetic memory device in accordance with the embodiment may include a substrate 100, a lower interlayer insulating layer 210, an upper interlayer insulating layer 220, a lower plug 300, a magnetic tunnel junction pattern 400, a capping pattern 500, a metal pattern 600, a side insulating layer 700, and an upper electrode 800 similar to the magnetic memory device FIG. 1.

The magnetic tunnel junction pattern 400 may include a seed pattern 410, a lower pinned pattern 420, a spacer 430, an upper pinned pattern 440, a first tunnel barrier 450, a free pattern 460, and a second tunnel barrier 470. The upper pinned pattern 440 may include a coupling enhancement pattern 441, a texture blocking pattern 442, and a polarization enhancement pattern 443.

The coupling enhancement pattern 441 may include a lower enhancement magnetic pattern 441LM, a lower enhancement non-magnetic pattern 441LN, an upper enhancement non-magnetic pattern 441UN, and an upper enhancement magnetic pattern 441UM.

The lower enhancement non-magnetic pattern 441LN may enhance a vertical magnetization characteristic of the lower enhancement magnetic pattern 441LM. The lower enhancement non-magnetic pattern 441LN may be located between the lower enhancement magnetic pattern 441LM and the upper enhancement non-magnetic pattern 441UN. The lower enhancement non-magnetic pattern 441LN may directly contact the lower enhancement magnetic pattern 441LM.

The lower enhancement non-magnetic pattern 441LN may include a non-magnetic material. A crystal structure of the lower enhancement non-magnetic pattern 441LN may be a HCP structure or a FCC structure. For example, the lower enhancement non-magnetic pattern 441LN may have substantially the same crystal structure as the lower enhancement magnetic pattern 441LM. For example, the lower enhancement non-magnetic pattern 441LN may include Pt, Pd, or Ir.

The upper enhancement non-magnetic pattern 441UN may enhance a vertical magnetization characteristic of the upper enhancement magnetic pattern 441UM. The upper enhancement non-magnetic pattern 441UN may be located between the lower enhancement non-magnetic pattern 441LN and the upper enhancement magnetic pattern 441UM. The upper enhancement non-magnetic pattern 441UN may directly contact the upper enhancement magnetic pattern 441UM.

The upper enhancement non-magnetic pattern 441UN may include a non-magnetic material. A crystal structure of the upper enhancement non-magnetic pattern 441UN may be a HCP structure or a FCC structure. For example, the upper enhancement non-magnetic pattern 441UN may have substantially the same crystal structure as the upper enhancement magnetic pattern 441UM. For example, the upper enhancement non-magnetic pattern 441UN may include Pt, Pd, or Ir.

The upper enhancement non-magnetic pattern 441UN may have substantially the same crystal structure as the lower enhancement non-magnetic pattern 441LN. The upper enhancement non-magnetic pattern 441UN may include a material different from the lower enhancement non-magnetic pattern 441LN.

Figure 5:
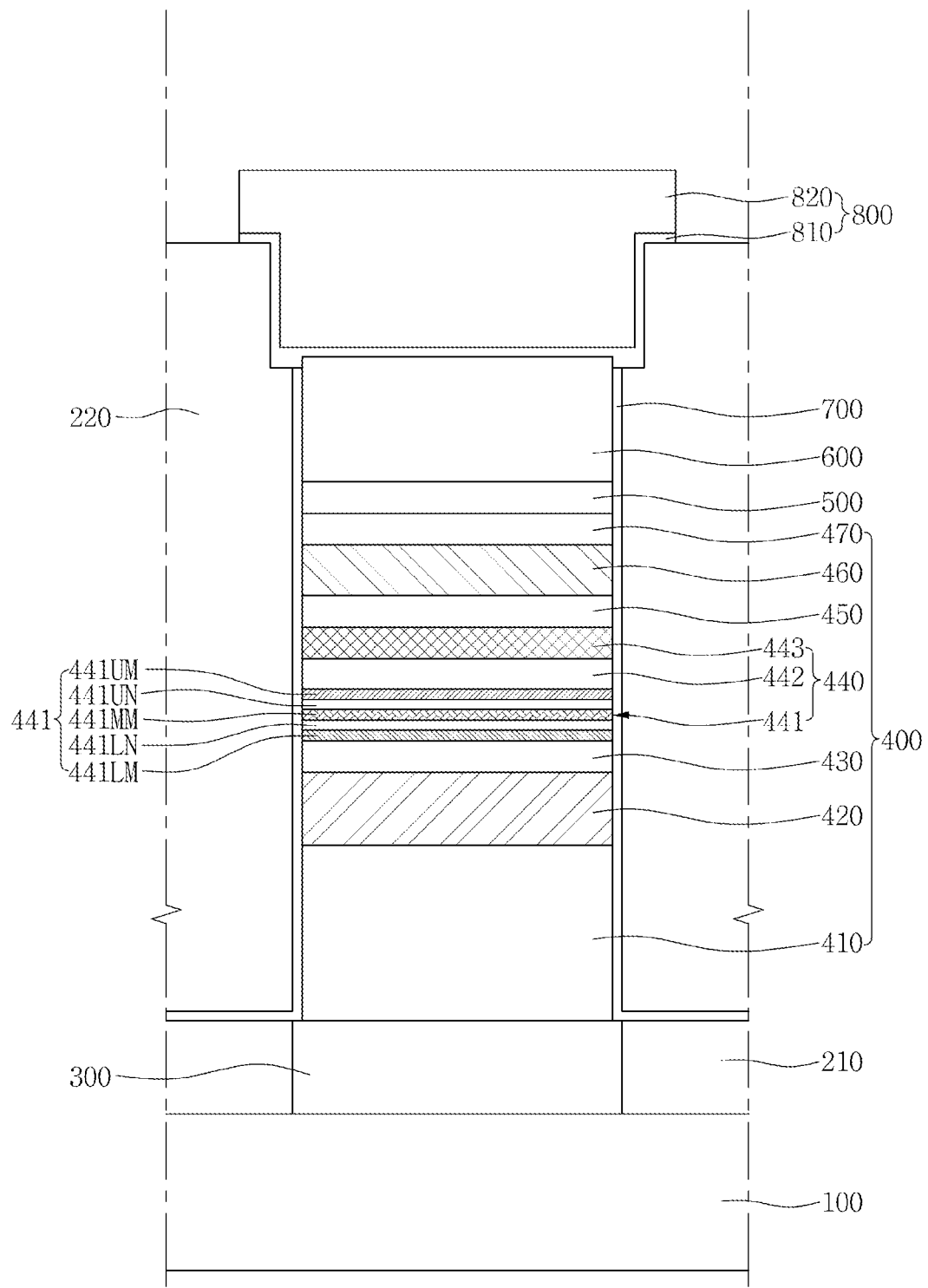
FIG. 5 is a schematic cross-sectional view showing a magnetic memory device in accordance with yet another embodiment.

FIG. 5 is a schematic cross-sectional view showing a magnetic memory device in accordance with yet another embodiment. Referring to FIG. 5, the magnetic memory device in accordance with the embodiment may include a substrate 100, a lower interlayer insulating layer 210, an upper interlayer insulating layer 220, a lower plug 300, a magnetic tunnel junction pattern 400, a capping pattern 500, a metal pattern 600, a side insulating layer 700, and an upper electrode 800 similar to the magnetic memory device FIG. 4.

The magnetic tunnel junction pattern 400 may include a seed pattern 410, a lower pinned pattern 420, a spacer 430, an upper pinned pattern 440, a first tunnel barrier 450, a free pattern 460, and a second tunnel barrier 470. The upper pinned pattern 440 may include a coupling enhancement pattern 441, a texture blocking pattern 442, and a polarization enhancement pattern 443.

The coupling enhancement pattern 441 may include a lower enhancement magnetic pattern 441LM, a lower enhancement non-magnetic pattern 441LN, an intermediate enhancement magnetic pattern 441MM, an upper enhancement non-magnetic pattern 441UN, and an upper enhancement magnetic pattern 441UM.

The intermediate enhancement magnetic pattern 441MM may be located between the lower enhancement non-magnetic pattern 441LN and the upper enhancement non-magnetic pattern 441UN. The intermediate enhancement magnetic pattern 441MM may directly contact the lower enhancement non-magnetic pattern 441LN. The intermediate enhancement magnetic pattern 441MM may directly contact the upper enhancement non-magnetic pattern 441UN.

The intermediate enhancement magnetic pattern 441MM may include a magnetic material. The intermediate enhancement magnetic pattern 441MM may have substantially the same magnetization direction as the lower enhancement magnetic pattern 441LM. The intermediate enhancement magnetic pattern 441MM may have substantially the same magnetization direction as the upper enhancement magnetic pattern 441UM. The intermediate enhancement magnetic pattern 441MM may have a vertical magnetization characteristic. For example, the intermediate enhancement magnetic pattern 441MM may include Co.

The vertical magnetization characteristic of the intermediate enhancement magnetic pattern 441MM may be enhanced by the lower enhancement non-magnetic pattern 441LN. The vertical magnetization characteristic of the intermediate enhancement magnetic pattern 441MM may be enhanced by the upper enhancement non-magnetic pattern 441UN. A crystal structure of the intermediate enhancement magnetic pattern 441MM may be a HCP structure or a FCC structure. For example, the intermediate enhancement magnetic pattern 441MM may have substantially the same crystal structure as the lower enhancement magnetic pattern 441LM. In another example, the intermediate enhancement magnetic pattern 441MM may have substantially the same crystal structure as the upper enhancement magnetic pattern 441UM.

Figure 6:
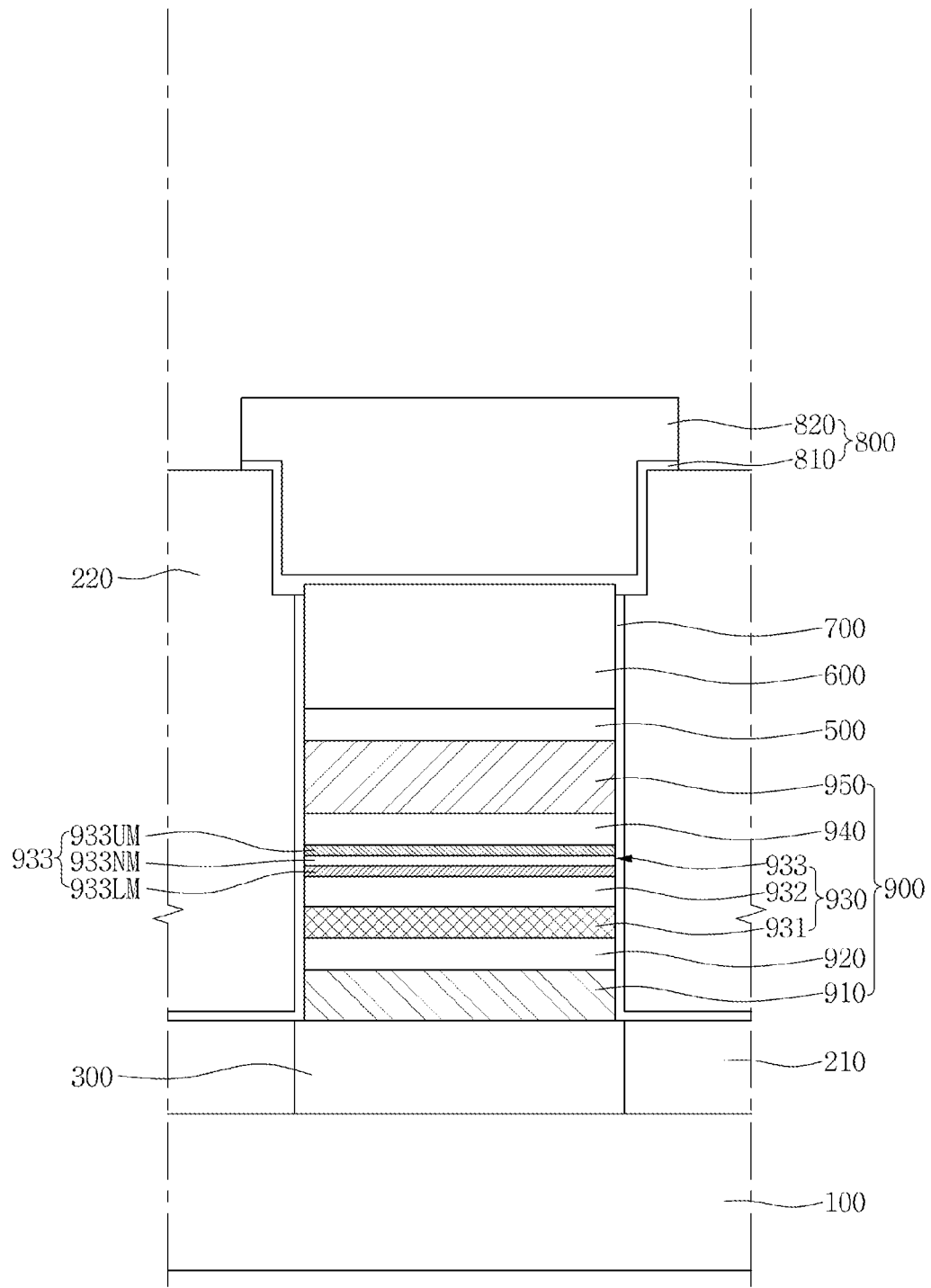
FIG. 6 is a schematic cross-sectional view showing a magnetic memory device in accordance with yet another embodiment.

FIG. 6 is a schematic cross-sectional view showing a magnetic memory device in accordance with yet another embodiment. Referring to FIG. 6, the magnetic memory device in accordance with the embodiment may include a substrate 100, a lower interlayer insulating layer 210, an upper interlayer insulating layer 220, a lower plug 300, a capping pattern 500, a metal pattern 600, a side insulating layer 700, and an upper electrode 800 similar to the magnetic memory device FIG. 1. However, the magnetic memory device includes a magnetic tunnel junction pattern 900.

The magnetic tunnel junction pattern 900 may include a free pattern 910, a tunnel barrier 920, a lower pinned pattern 930, a spacer 940, and an upper pinned pattern 950.

The free pattern 910 may be located close to the lower plug 300. The free pattern 910 may directly contact the lower plug 300. A magnetization direction of the free pattern 910 may be changed by a magnetic field formed between the lower plug 300 and the upper electrode 800.

The tunnel barrier 920 may be located on the free pattern 910. The tunnel barrier 920 may directly contact the free pattern 910.

The lower pinned pattern 930 may be located on the tunnel bather 920. The lower pinned pattern 930 may include a polarization enhancement pattern 931, a texture blocking pattern 932, and a coupling enhancement pattern 933.

The polarization enhancement pattern 931 may be located close to the tunnel barrier 920. The polarization enhancement pattern 931 may directly contact the tunnel barrier 920. A magnetization direction of the polarization enhancement pattern 931 may not be changed by a magnetic field formed between the lower plug 300 and the upper electrode 800.

The texture blocking pattern 932 may be located on the polarization enhancement pattern 931. The texture blocking pattern 932 may directly contact the polarization enhancement pattern 931. For example, the texture blocking pattern 932 may be amorphous.

The coupling enhancement pattern 933 may be located on the texture blocking pattern 932. The coupling enhancement pattern 933 may include a lower enhancement magnetic pattern 933LM, an enhancement non-magnetic pattern 933NM, and an upper enhancement magnetic pattern 933UM.

A vertical magnetization characteristic of the lower enhancement magnetic pattern 933LM may be enhanced by the enhancement non-magnetic pattern 933NM. A vertical magnetization characteristic of the upper enhancement magnetic pattern 933UM may be enhanced by the enhancement non-magnetic pattern 933NM.

The spacer 940 may be located on the coupling enhancement pattern 933. The spacer 940 may directly contact the upper enhancement magnetic pattern 933UM.

The upper pinned pattern 950 may be located between the spacer 940 and the capping pattern 500. The upper pinned pattern 950 may directly contact the spacer 940. The capping pattern 500 may directly contact the upper pinned pattern 950.

In other embodiments, the magnetic tunnel junction pattern 900 may include structures similar to the magnetic tunnel junction patterns 400 of FIGS. 1-5. That is, the magnetic tunnel junction pattern 900 may include substantially the same layers as a magnetic tunnel junction pattern 400 of any of FIGS. 1-5, but with the order of the layers reversed with respect to the layers surrounding the magnetic tunnel junction pattern 900.

Figure 7:
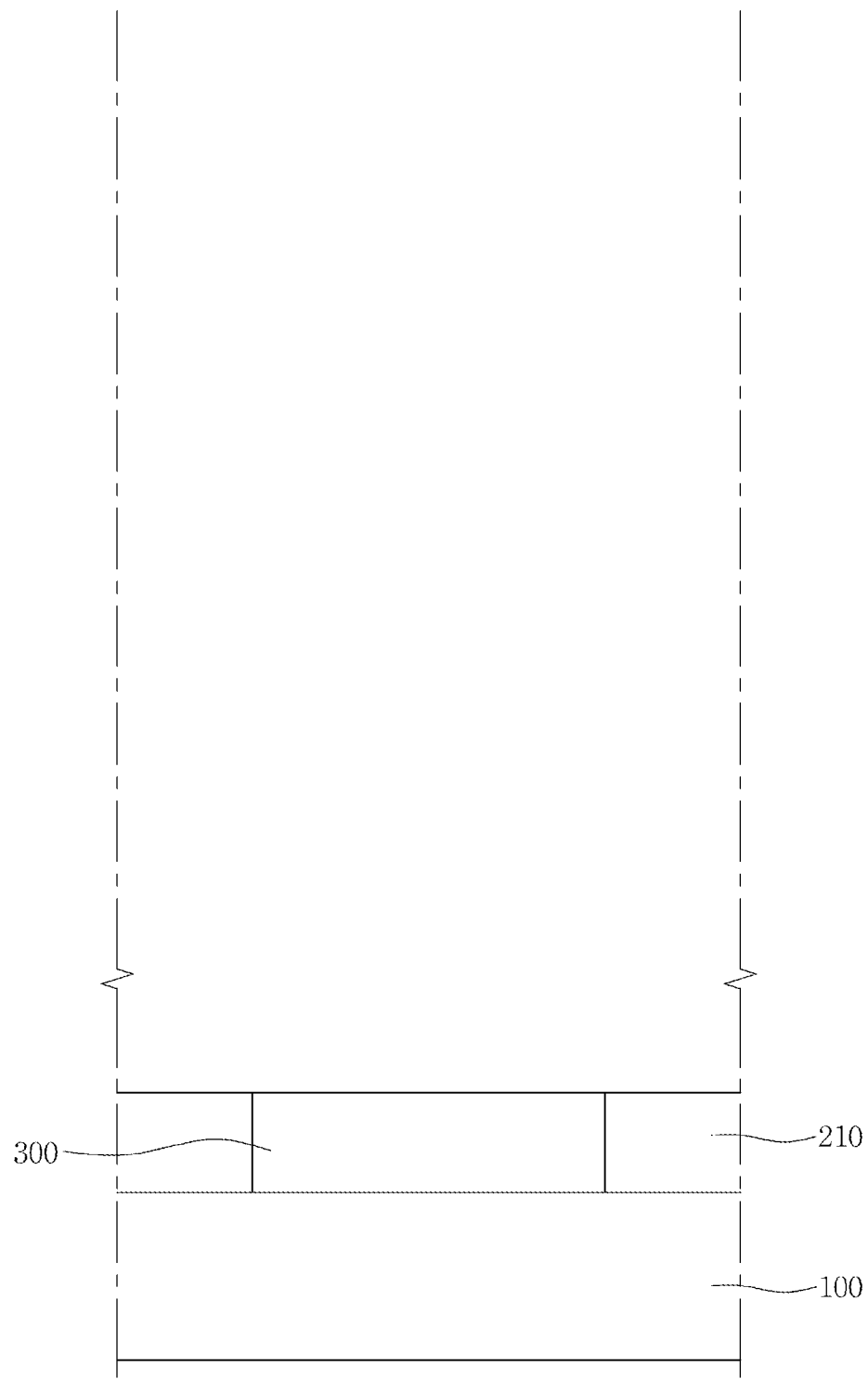
FIGS. 7 to 28 are cross-sectional views sequentially showing a method of forming the magnetic memory device in accordance with an embodiment.

FIGS. 7 to 28 are cross-sectional views sequentially showing a method of forming the magnetic memory device in accordance with an embodiment. The method of forming the magnetic memory device in accordance with the embodiment will be described with reference to FIGS. 7 to 28. First, referring to FIG. 7, the method of forming the magnetic memory device in accordance with the embodiment may include a process of forming a lower plug 300 on a substrate 100.

The process of forming the lower plug 300 on the substrate 100 may include a process of forming a lower interlayer insulating layer 210 on the substrate 100, a process of forming a lower contact hole in the lower interlayer insulating layer 210, and a process of forming the lower plug 300 in the lower contact hole.

Figure 8:
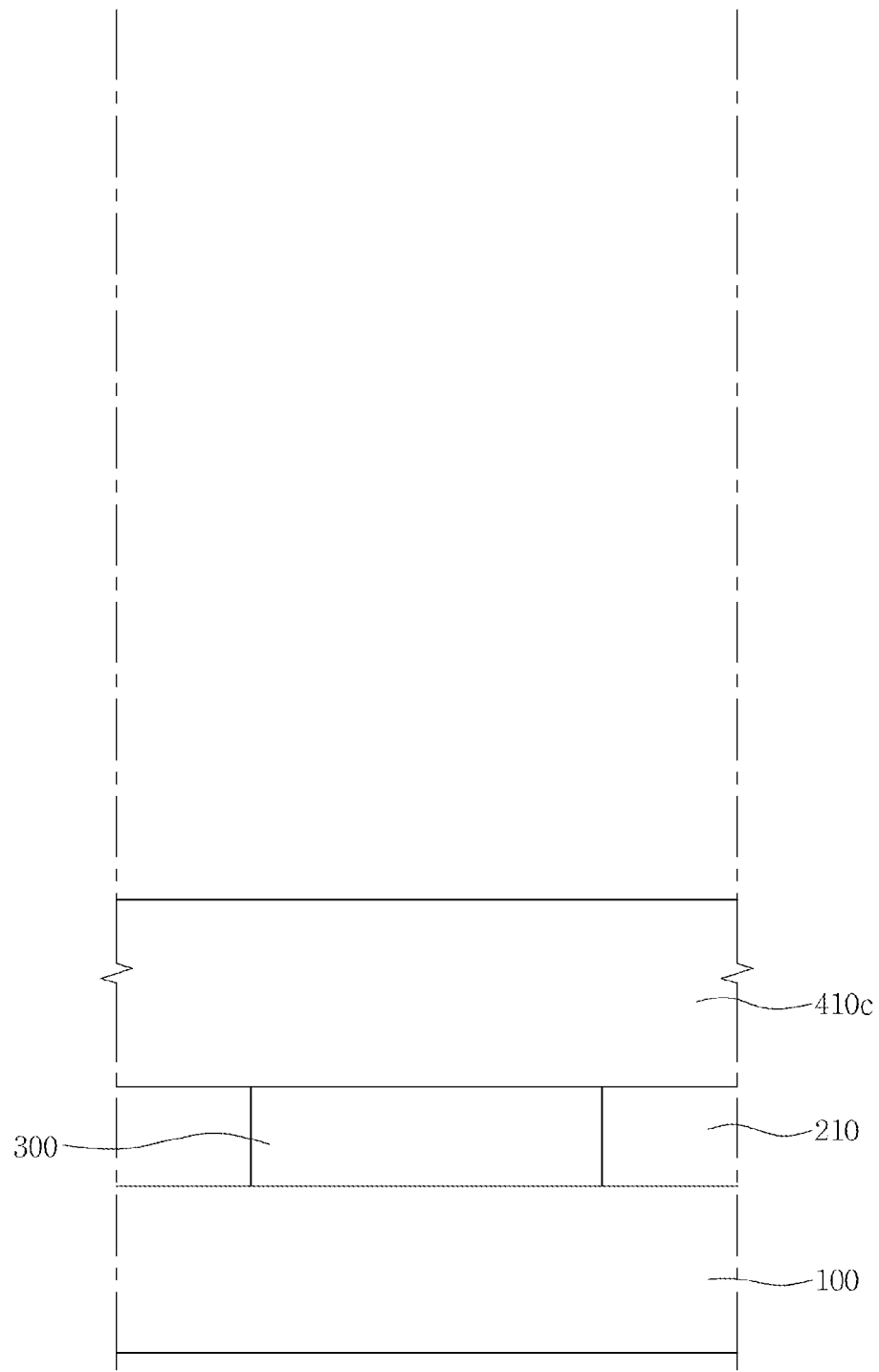

Referring to FIG. 8, the method of forming the magnetic memory device in accordance with the embodiment may include a process of forming a seed layer 410c on the lower plug 300.

The process of forming the seed layer 410c may include a process of depositing a crystal material which is a material having a predetermined crystal structure on the lower plug 300. For example, the process of forming the seed layer 410c may include a process of forming a crystalline layer including one of Ru, Ti, and Ta.

Figure 9:
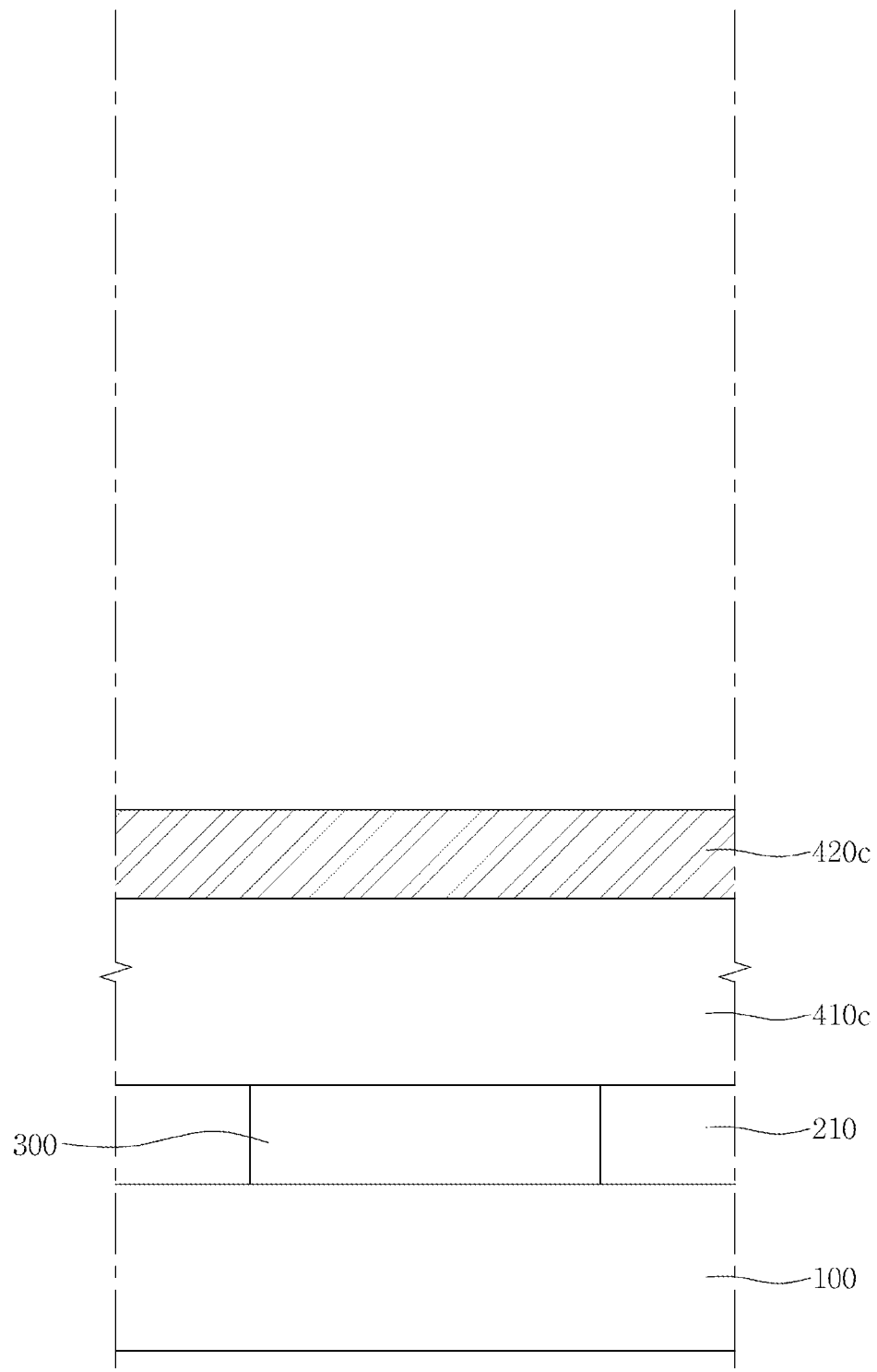

Referring to FIG. 9, the method of forming the magnetic memory device in accordance with the embodiment may include a process of forming a lower pinned layer 420c on the seed layer 410c.

The process of forming the lower pinned layer 420c may include a process of depositing a crystal material which is a magnetic material on the seed layer 410c. The process of forming the lower pinned layer 420c may include a process of depositing a material having a vertical magnetization characteristic. For example, the process of forming the lower pinned layer 420c may include a process of forming a crystalline layer including at least one of Co, Fe, and Ni, and one of Pt, Pd, Ru, and Ta.

A crystal structure of the lower pinned layer 420c may be affected by the seed layer 410c. For example, the lower pinned layer 420c may have substantially the same crystal structure as the seed layer 410c.

Figure 10:
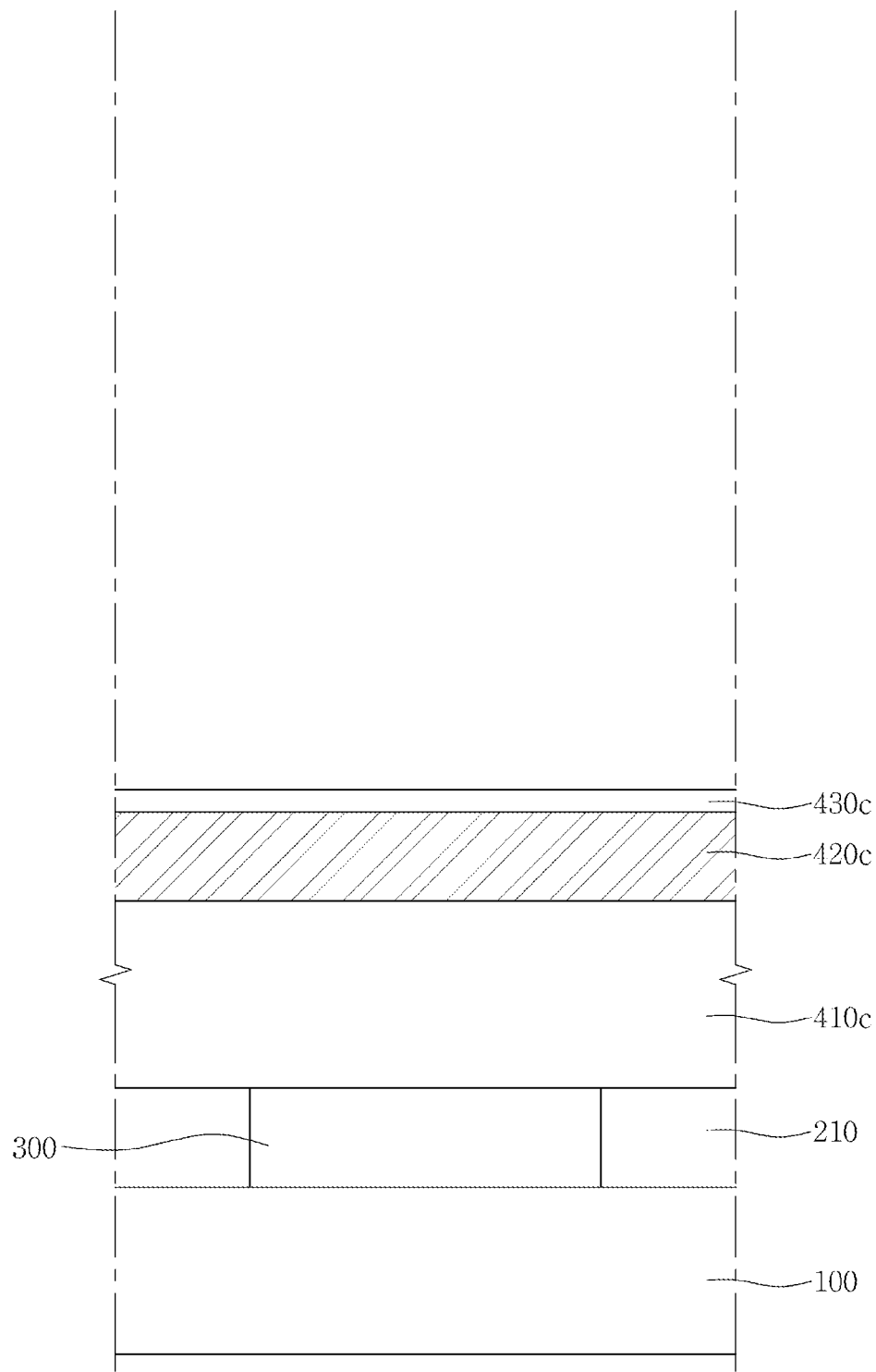

Referring to FIG. 10, the method of forming the magnetic memory device in accordance with the embodiment may include a process of forming a spacer layer 430c on the lower pinned layer 420c.

The process of forming the spacer layer 430c may include a process of depositing a crystal material which is a material having a predetermined crystal structure on the lower pinned layer 420c. For example, the process of forming the spacer layer 430c may include a process of forming a crystalline layer including one of Ru, Ir, Re, and Os.

Figure 11:
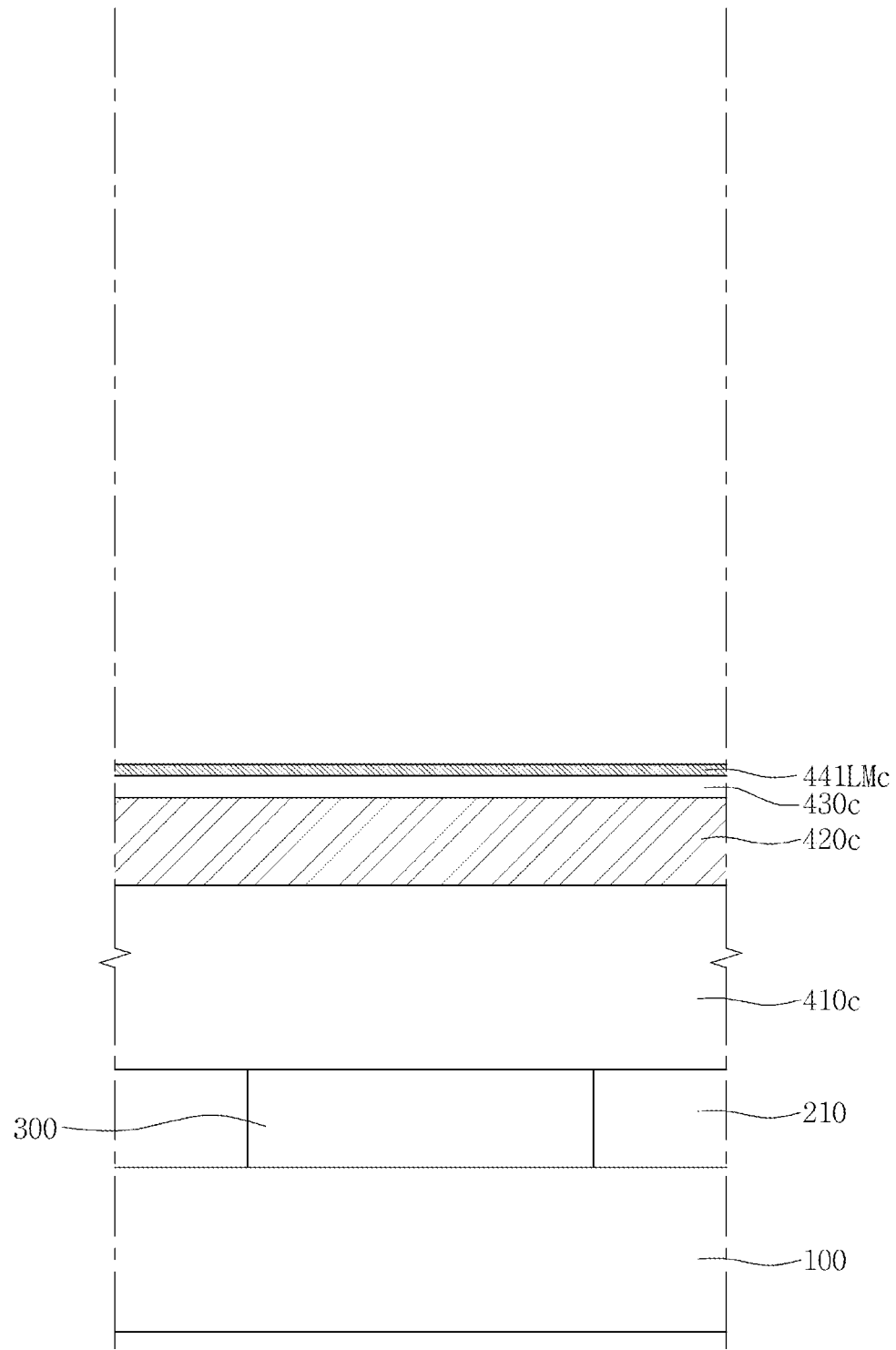

Referring to FIG. 11, the method of forming the magnetic memory device in accordance with the embodiment may include a process of forming a lower enhancement magnetic layer 441LMc on the spacer layer 430c.

The process of forming the lower enhancement magnetic layer 441LMc may include a process of depositing a crystal material which is a magnetic material on the spacer layer 430c. The process of forming the lower enhancement magnetic layer 441LMc may include a process of depositing a material having a vertical magnetization characteristic. For example, the process of forming the lower enhancement magnetic layer 441LMc may include a process of forming a crystalline layer including Co.

A crystal structure of the lower enhancement magnetic layer 441LMc may be affected by the spacer layer 430c. For example, the crystal structure of the lower enhancement magnetic layer 441LMc may be a HCP or a FCC. For example, the lower enhancement magnetic layer 441LMc may have substantially the same crystal structure as the spacer layer 430c.

Figure 12A:
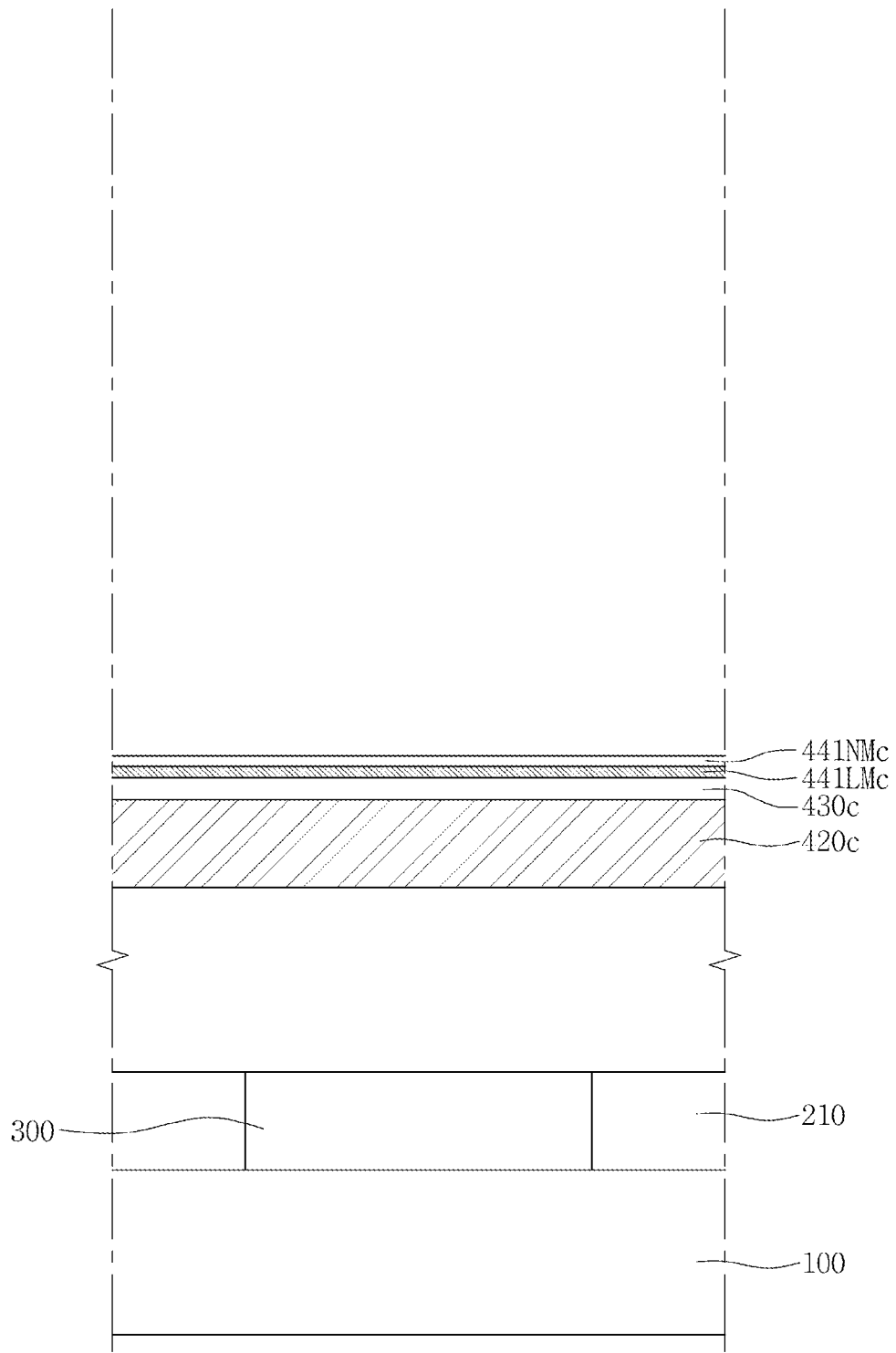

Referring to FIG. 12A, the method of forming the magnetic memory device in accordance with the embodiment may include a process of forming an enhancement non-magnetic layer 441NMc on the lower enhancement magnetic layer 441LMc.

The process of forming the enhancement non-magnetic layer 441NMc may include a process of depositing a crystal material which is a non-magnetic material on the lower enhancement magnetic layer 441LMc. The process of forming the enhancement non-magnetic layer 441NMc may include a process of depositing a material which is able to enhance a vertical magnetization characteristic of the lower enhancement magnetic layer 441LMc. For example, the process of forming the enhancement non-magnetic layer 441NMc may include a process of forming a crystalline layer including Pt, Pd, or Ir.

A crystal structure of the enhancement non-magnetic layer 441NMc may be affected by that of the lower enhancement magnetic layer 441LMc. For example, the crystal structure of the enhancement non-magnetic layer 441NMc may be a HCP or a FCC. For example, the enhancement non-magnetic layer 441NMc may have substantially the same crystal structure as the lower enhancement magnetic layer 441LMc.

Figure 12B:
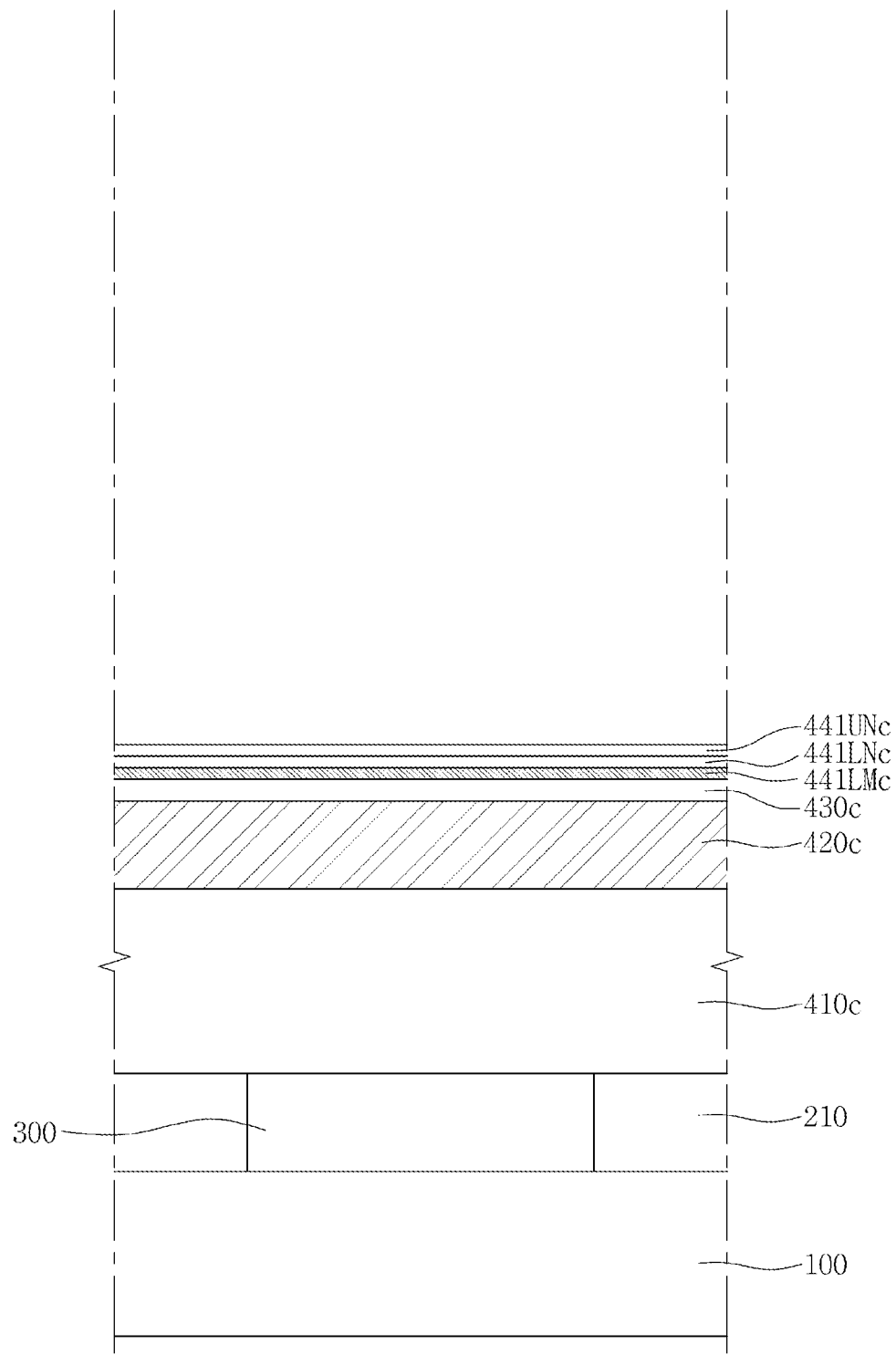

Referring to FIG. 12B, the method of forming the magnetic memory device in accordance with the embodiment may include a process of forming a lower enhancement non-magnetic layer 441LNc on the lower enhancement magnetic layer 441LMc and forming an upper enhancement non-magnetic layer 441UNc on the lower enhancement non-magnetic layer 441LNc.

The process of forming the lower enhancement non-magnetic layer 441LNc may include a process of depositing a crystal material which is a non-magnetic material on the lower enhancement magnetic layer 441LMc. The process of forming the lower enhancement non-magnetic layer 441LNc may include a process of depositing a material which is able to enhance a vertical magnetization characteristic of the lower enhancement magnetic layer 441LMc. For example, the process of forming the lower enhancement non-magnetic layer 441LNc may include a process of forming a crystalline layer including Pt, Pd, or Ir.

A crystal structure of the lower enhancement non-magnetic layer 441LNc may be affected by that of the lower enhancement magnetic layer 441LMc. For example, the crystal structure of the lower enhancement non-magnetic layer 441LNc may be a HCP or a FCC. For example, the lower enhancement non-magnetic layer 441LNc may have substantially the same crystal structure as the lower enhancement magnetic layer 441LMc.

The process of forming the upper enhancement non-magnetic layer 441UNc may include a process of depositing a crystal material which is a non-magnetic material on the lower enhancement non-magnetic layer 441LNc. The process of forming the upper enhancement non-magnetic layer 441UNc may include a process of depositing a material which is able to enhance a vertical magnetization characteristic of the upper enhancement magnetic layer 441UMc, formed at a later stage. For example, the process of forming the upper enhancement non-magnetic layer 441UNc may include a process of forming a crystalline layer including Pt, Pd, or Ir.

A crystal structure of the upper enhancement non-magnetic layer 441UNc may be affected by that of the lower enhancement non-magnetic layer 441LNc. For example, the crystal structure of the upper enhancement non-magnetic layer 441UNc may be a HCP or a FCC. For example, the upper enhancement non-magnetic layer 441UNc may have substantially the same crystal structure as the lower enhancement non-magnetic layer 441LNc.

Although subsequent figures may refer to processes performed on a structure including the enhancement non-magnetic layer 441NMc of FIG. 12A, similar processes may be performed with respect to a structure including the lower enhancement non-magnetic layer 441LNc and the upper enhancement non-magnetic layer 441UNc.

Figure 12C:
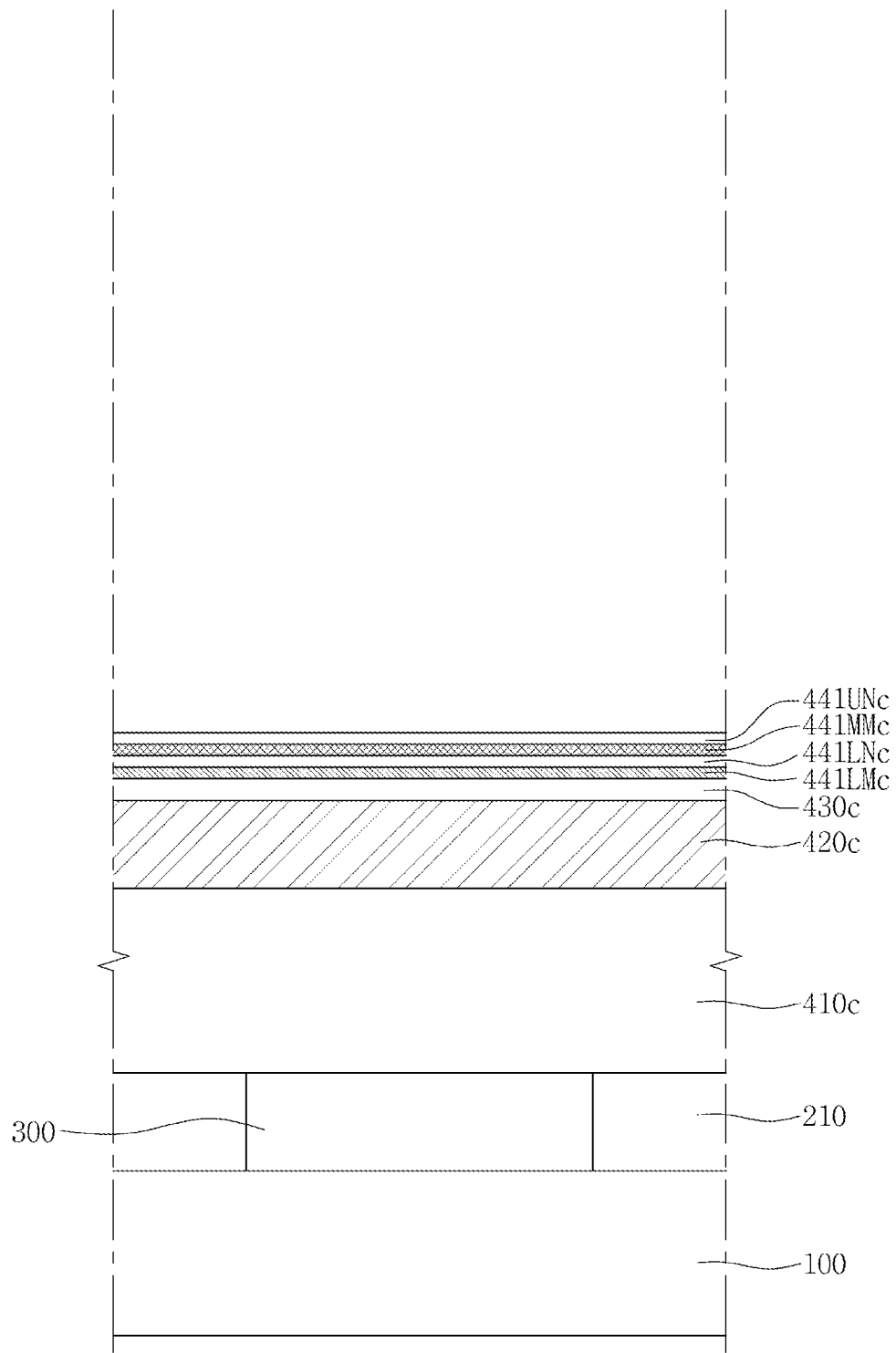

Referring to FIG. 12C, the method of forming the magnetic memory device in accordance with the embodiment may include a process of forming a lower enhancement non-magnetic layer 441LNc on the lower enhancement magnetic layer 441LMc, forming an intermediate enhancement magnetic layer 441MMc on the lower enhancement non-magnetic layer 441LNc, and forming an upper enhancement non-magnetic layer 441UNc on the intermediate enhancement magnetic layer 441MMc.

The lower enhancement non-magnetic layer 441LNc and the upper enhancement non-magnetic layer 441UNc may be formed similarly to the lower enhancement non-magnetic layer 441LNc and the upper enhancement non-magnetic layer 441UNc described with respect to FIG. 12B. However, in this embodiment, the intermediate enhancement magnetic layer 441MMc is formed before forming the upper enhancement non-magnetic layer 441UNc.

The process of forming the intermediate enhancement magnetic layer 441MMc may include a process of depositing a crystal material which is a magnetic material on the lower enhancement non-magnetic layer 441LNc. The process of forming the intermediate enhancement magnetic layer 441MMc may include a process of depositing a material having a vertical magnetization characteristic. For example, the process of forming the lower enhancement magnetic layer 441LMc may include a process of forming a crystalline layer including Co.

A crystal structure of the lower enhancement magnetic layer 441LMc may be affected by the lower enhancement non-magnetic layer 441LNc. For example, the crystal structure of the intermediate enhancement magnetic layer 441MMc may be a HCP or a FCC. For example, the lower enhancement magnetic layer 441LMc may have substantially the same crystal structure as the lower enhancement non-magnetic layer 441LNc.

Although subsequent figures may refer to processes performed on a structure including the enhancement non-magnetic layer 441NMc of FIG. 12A, similar processes may be performed with respect to a structure including the lower enhancement non-magnetic layer 441LNc, intermediate enhancement magnetic layer 441MMc, and the upper enhancement non-magnetic layer 441UNc.

Figure 13:
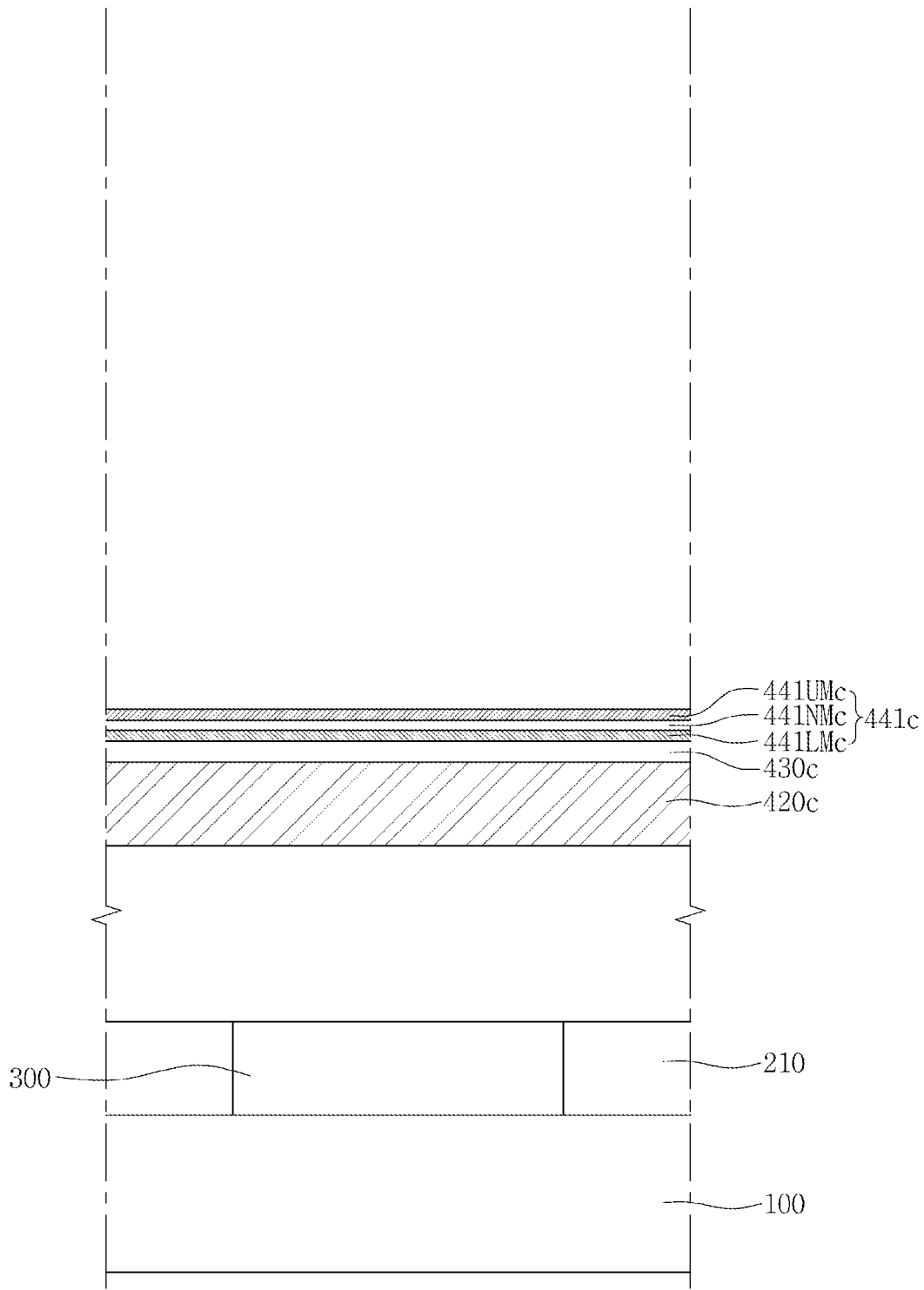

Referring to FIG. 13, the method of forming the magnetic memory device in accordance with the embodiment may include a process of forming a coupling enhancement layer 441c on the substrate 100.

The process of forming the coupling enhancement layer 441c may include a process of forming an upper enhancement magnetic layer 441UMc on the enhancement non-magnetic layer 441NMc. The coupling enhancement layer 441c may include the lower enhancement magnetic layer 441LMc, the enhancement non-magnetic layer 441NMc, and the upper enhancement magnetic layer 441UMc.

The process of forming the upper enhancement magnetic layer 441UMc may include a process of depositing a crystal material which is a magnetic material on the enhancement non-magnetic layer 441NMc. The process of forming the upper enhancement magnetic layer 441UMc may include a process of depositing a material having a vertical magnetization characteristic. The process of forming the upper enhancement magnetic layer 441UMc may include a process of depositing a material of which the vertical magnetization characteristic is enhanced by the enhancement non-magnetic layer 441NMc. For example, the process of forming the upper enhancement magnetic layer 441UMc may include a process of forming a crystalline layer including Co.

A crystal structure of the upper enhancement magnetic layer 441UMc may be affected by the enhancement non-magnetic layer 441NMc. For example, the crystal structure of the upper enhancement magnetic layer 441UMc may be a HCP or a FCC. The upper enhancement magnetic layer 441UMc may include substantially the same material as the lower enhancement magnetic layer 441LMc. For example, the upper enhancement magnetic layer 441UMc may have substantially the same crystal structure as the lower enhancement magnetic layer 441LMc.

Figure 14A:
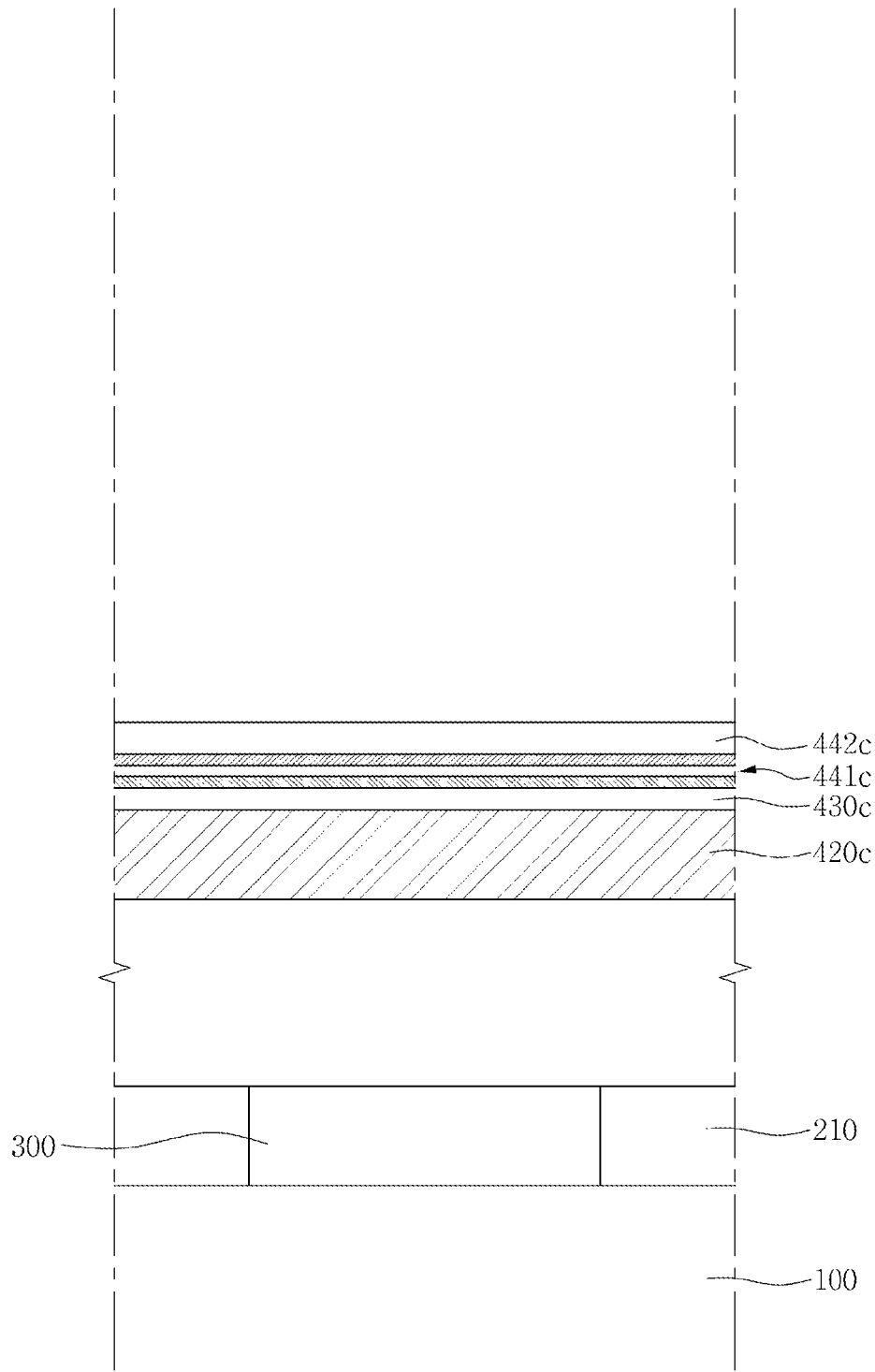

Referring to FIG. 14A, the method of forming the magnetic memory device in accordance with the embodiment may include a process of forming a texture blocking layer 442c on the coupling enhancement layer 441c.

The process of forming the texture blocking layer 442c may include a process of forming an amorphous layer including a magnetic material and an amorphization material on the coupling enhancement layer 441c. For example, the process of forming the texture blocking layer 442c may include a process of forming an amorphous layer including at least one of Co, Fe, and Ni, and one of B, Si, Zr, Hf, Be, Al, C, Mo, Ta, and Cu.

Figure 14B:
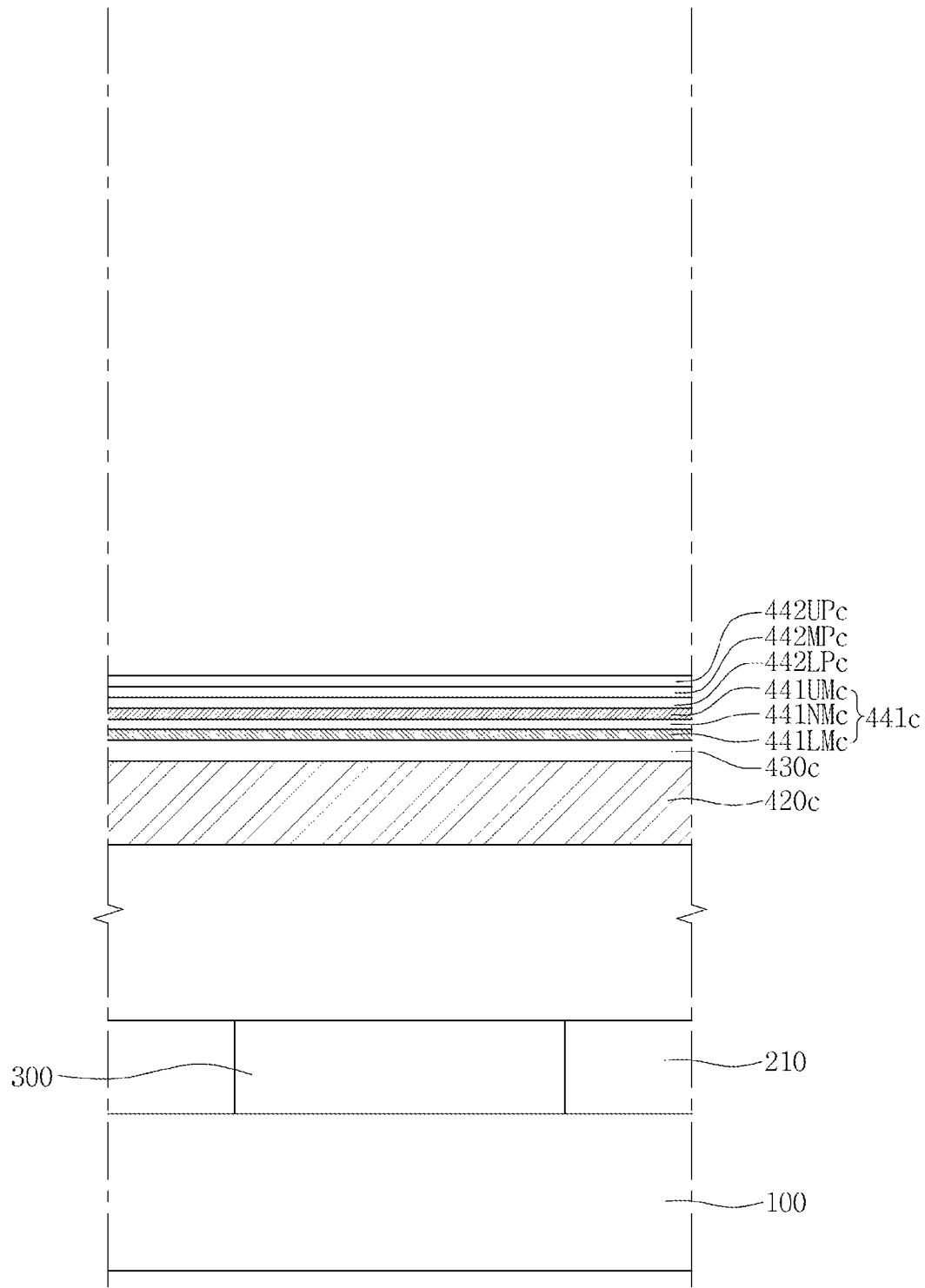

Referring to FIG. 14B, the method of forming the magnetic memory device in accordance with the embodiment may include a process of forming a texture blocking layer 442c, including a lower blocking non-magnetic layer 442LPc, a blocking magnetic layer 442MPc, and an upper blocking non-magnetic layer 442UPc, on the coupling enhancement layer 441c.

The process of forming the lower blocking non-magnetic layer 442LPc may include a process of depositing a non-magnetic material on the coupling enhancement layer 441c. For example, the process may include depositing a material including Ta, W, Hf, Nb, Mo, Ti, Re, Os, Tc, or Nd.

The process of forming the blocking magnetic layer 442MPc may include depositing an amorphization material on the lower blocking non-magnetic layer 442LPc. For example, the process may include depositing a material including at least one of Co, Fe, and Ni, and one of B, Si, Zr, Hf, Be, Al, C, Mo, Ta, and Cu.

The process of forming the upper blocking non-magnetic layer 442UPc may include a process of depositing a non-magnetic material on the blocking magnetic layer 442MPc. For example, the process may include depositing a material including Ta, W, Hf, Nb, Mo, Ti, Re, Os, Tc, or Nd.

Although subsequent figures may refer to processes performed on a structure including the texture blocking layer 442c of FIG. 14A, similar processes may be performed with respect to a structure including the lower blocking non-magnetic layer 442LPc, the blocking magnetic layer 442MPc, and the upper blocking non-magnetic layer 442UPc.

Figure 15:
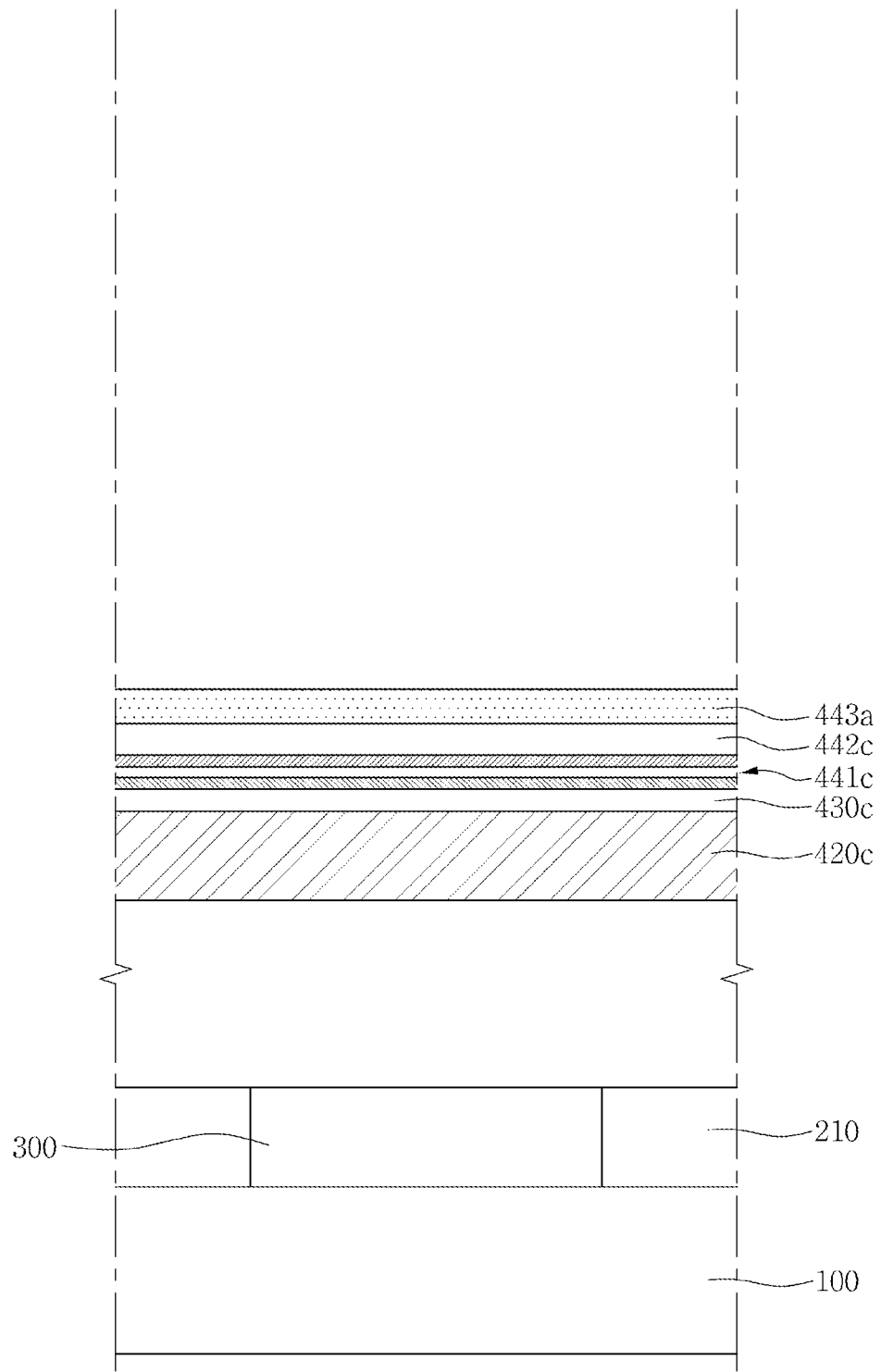

Referring to FIG. 15, the method of forming the magnetic memory device in accordance with the embodiment may include a process of forming a preliminary polarization enhancement layer 443a on the texture blocking layer 442c.

The process of forming the preliminary polarization enhancement layer 443a may include a process of forming an amorphous layer including a magnetic material and an amorphization material on the texture blocking layer 442c. For example, the process of forming the preliminary polarization enhancement layer 443a may include a process of forming an amorphous layer including at least one of Co, Fe, and Ni, and one of B, Si, Zr, Hf, Be, Al, C, Mo, Ta, and Cu.

A crystallization temperature of the preliminary polarization enhancement layer 443a may be lower than that of the texture blocking layer 442c. The texture blocking layer 442c may be crystallized later than the preliminary polarization enhancement layer 443a. For example, the process of forming the preliminary polarization enhancement layer 443a may include a process of forming an amorphous layer having an amorphization material of which content is lower than that of an amorphization material of the texture blocking layer 442c.

Figure 16:
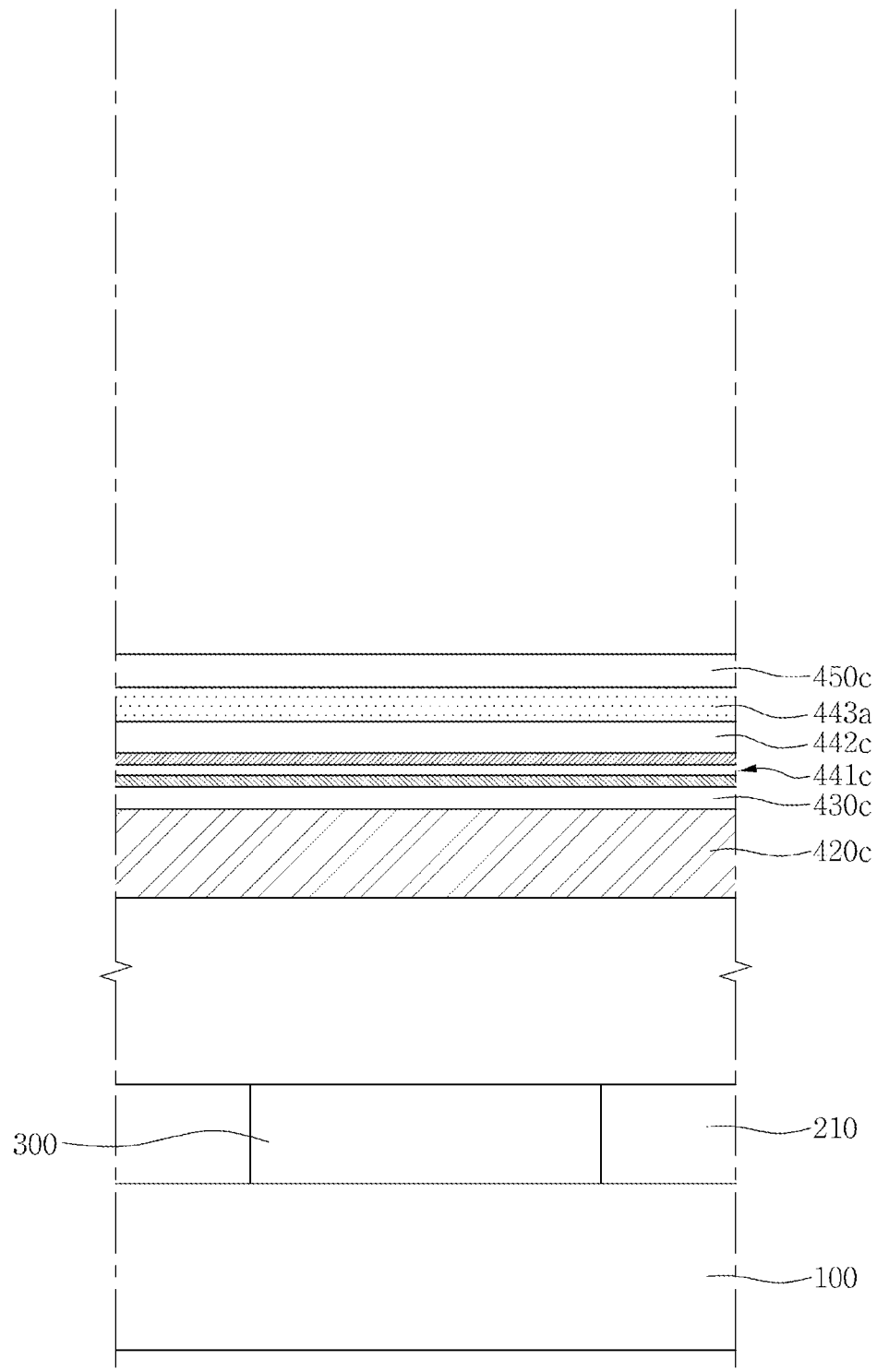

Referring to FIG. 16, the method of forming the magnetic memory device in accordance with the embodiment may include a process of forming a first tunnel barrier layer 450c on the preliminary polarization enhancement layer 443a.

The process of forming the first tunnel barrier layer 450c may include a process of depositing a crystal material which is a non-magnetic material on the preliminary polarization enhancement layer 443a. For example, the process of forming the first tunnel barrier layer 450c may include a process of forming a crystalline layer including MgO.

Figure 17:
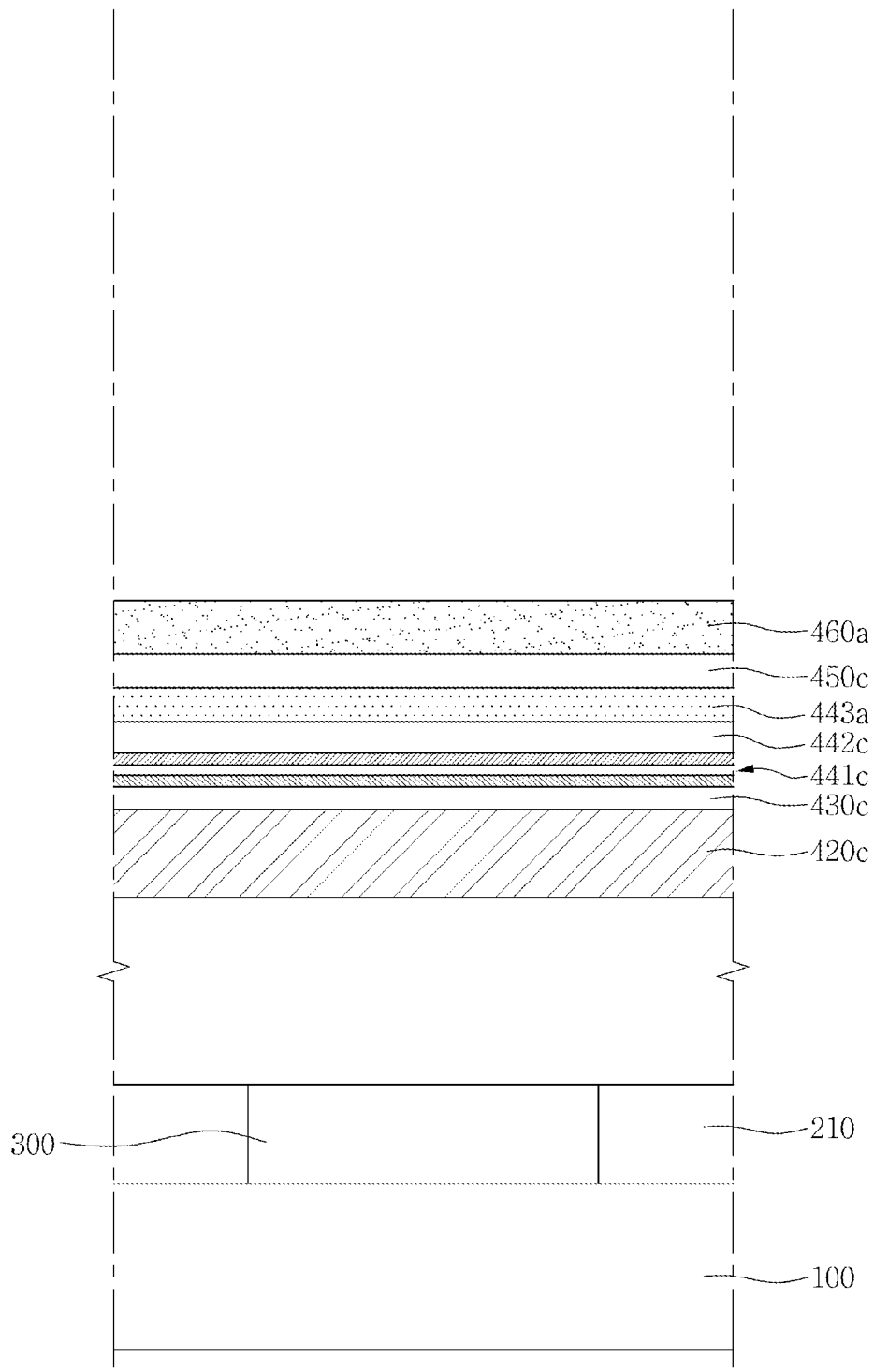

Referring to FIG. 17, the method of forming the magnetic memory device in accordance with the embodiment may include a process of forming a preliminary free layer 460a on the first tunnel barrier layer 450c.

The process of forming the preliminary free layer 460a may include a process of forming an amorphous layer including a magnetic material and an amorphization material on the first tunnel barrier layer 450c. For example, the process of forming the preliminary free layer 460a may include a process of forming an amorphous layer including at least one of Co, Fe, and Ni, and one of B, Si, Zr, Hf, Be, Al, C, Mo, Ta, and Cu.

A crystallization temperature of the preliminary free layer 460a may be lower than that of the texture blocking layer 442c. The texture blocking layer 442c may be crystallized later than the preliminary free layer 460a. For example, the process of forming the preliminary free layer 460a may include a process of forming an amorphous layer having an amorphization material of which content is lower than that of an amorphization material of the texture blocking layer 442c.

Figure 18:
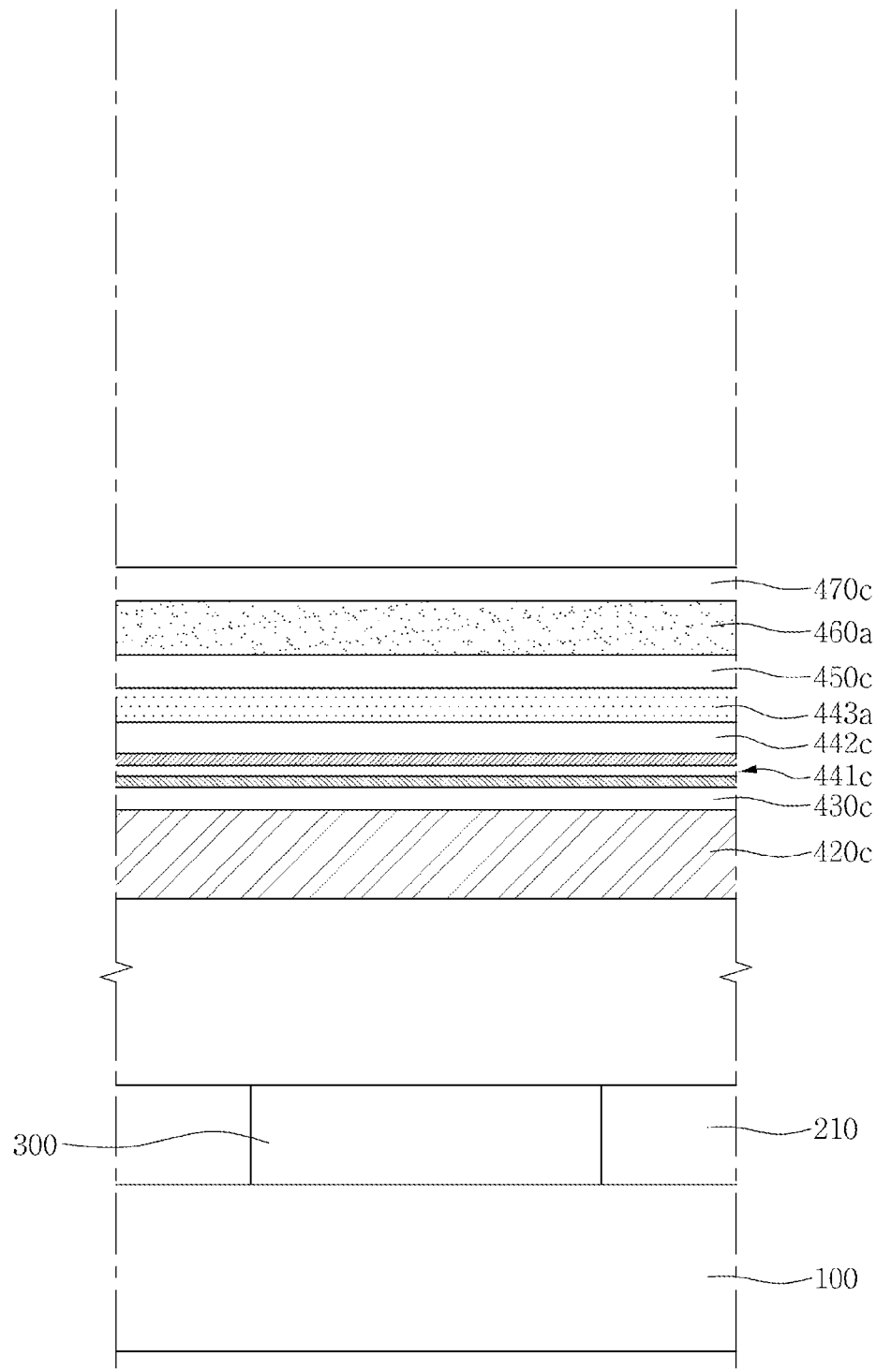

Referring to FIG. 18, the method of forming the magnetic memory device in accordance with the embodiment may include a process of forming a second tunnel barrier layer 470c on the preliminary free layer 460a.

The process of forming the second tunnel barrier layer 470c may include a process of depositing a crystal material which is a non-magnetic material on the preliminary free layer 460a. For example, the process of forming the second tunnel barrier layer 470c may include a process of forming a crystalline layer including MgO.

In an embodiment, forming the second tunnel barrier layer 470c may be omitted. Although subsequent figures may refer to processes performed on a structure including the second tunnel barrier layer 470c, similar processes may be performed with respect to a structure without the second tunnel barrier layer 470c.

Figure 19:
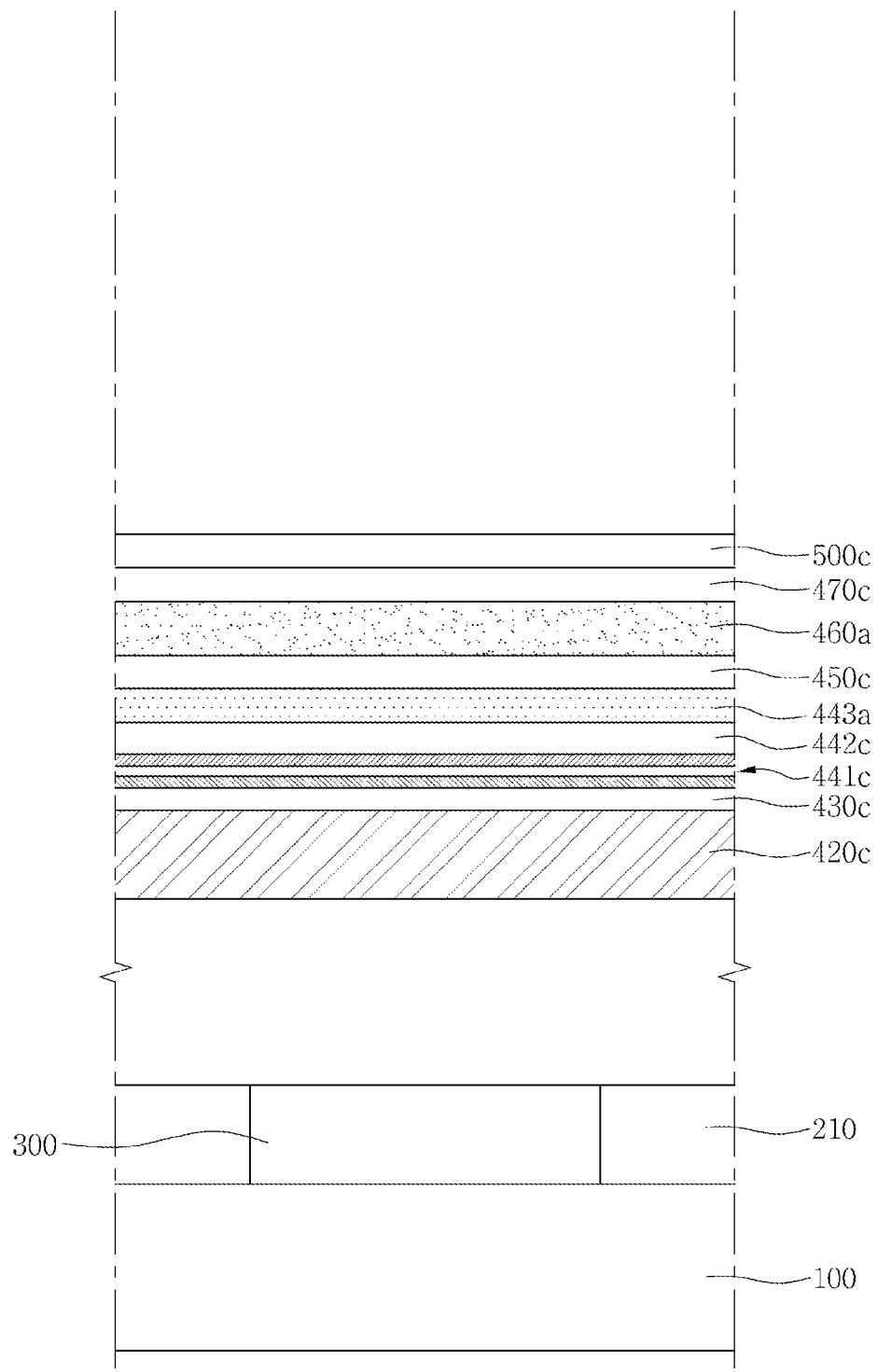

Referring to FIG. 19, the method of forming the magnetic memory device in accordance with the embodiment may include a process of forming a capping layer 500c on the second tunnel barrier layer 470c.

For example, the process of forming the capping layer 500c may include a process of forming a crystalline layer including one of Ta, Al, Cu, Au, Ti, TaN, and TiN on the second tunnel barrier layer 470c.

Figure 20:
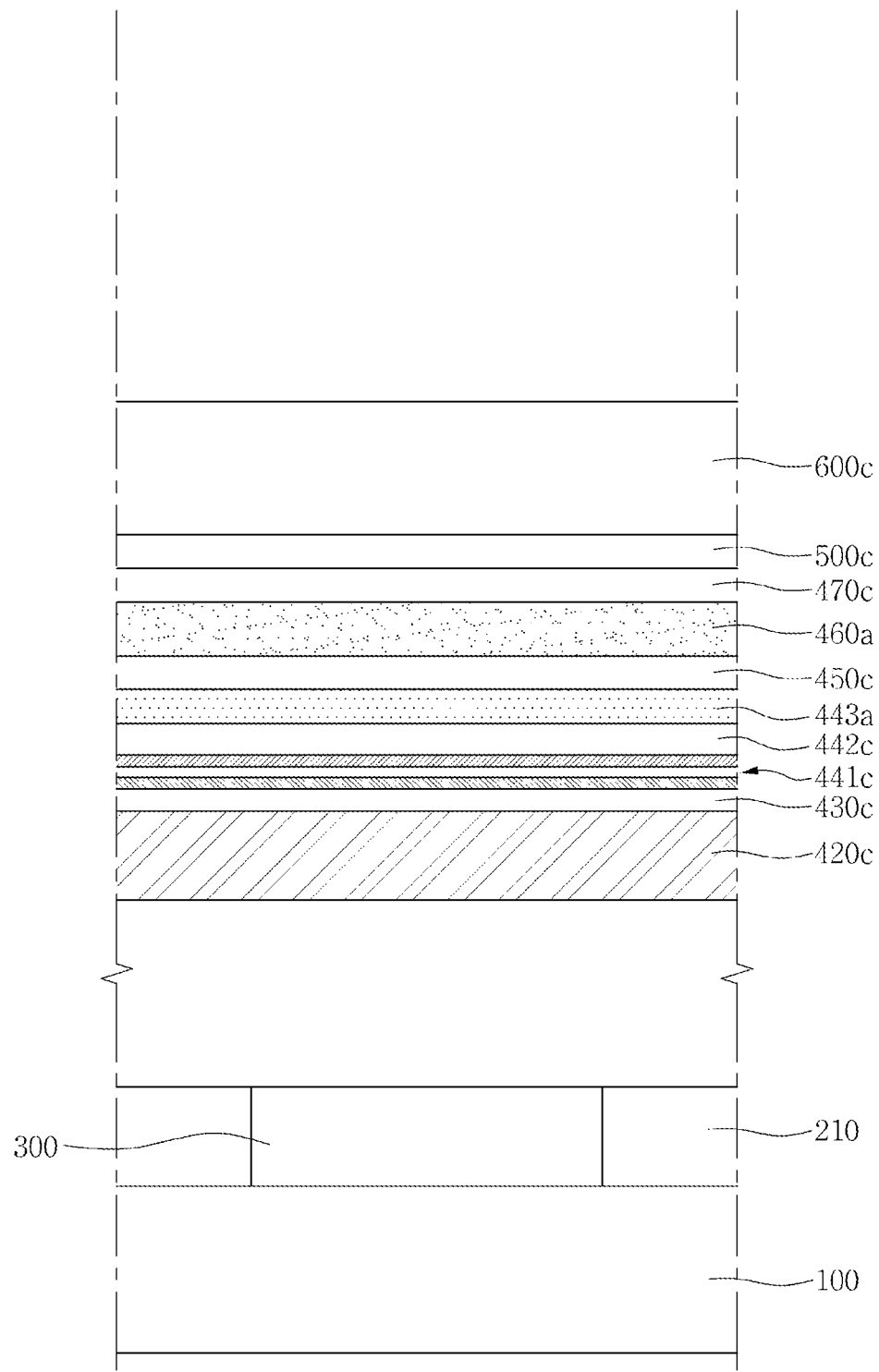

Referring to FIG. 20, the method of forming the magnetic memory device in accordance with the embodiment may include a process of forming a metal mask layer 600c on the capping layer 500c.

The process of forming the metal mask layer 600c may include a process of depositing a crystal material which is a conductive material on the capping layer 500c. For example, the process of forming the metal mask layer 600c may include a process of forming a crystalline layer including a metal nitride or a metal.

Figure 21:
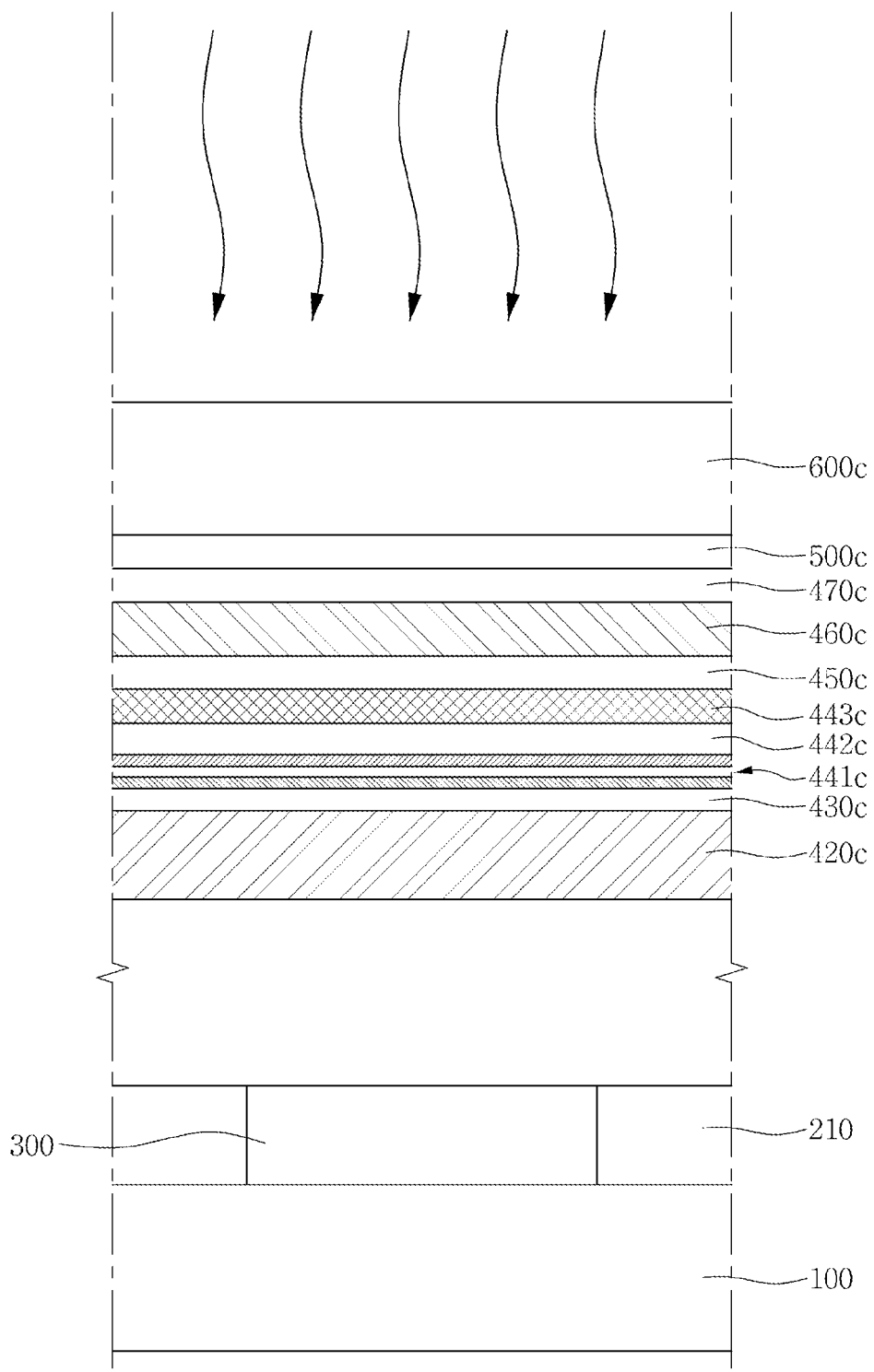

Referring to FIG. 21, the method of forming the magnetic memory device in accordance with the embodiment may include a process of forming a polarization enhancement layer 443c and a free layer 460c on the substrate 100.

The process of forming the polarization enhancement layer 443c and the free layer 460c may include a process of crystallizing the preliminary polarization enhancement layer 443a and the preliminary free layer 460a. The process of crystallizing the preliminary polarization enhancement layer 443a and the preliminary free layer 460a may include an annealing process of the substrate 100 in which the metal mask layer 600c is formed.

In the method of forming the magnetic memory device in accordance with the embodiment, the coupling enhancement layer 441c is formed by sequentially stacking the lower enhancement magnetic layer 441LMc, the enhancement non-magnetic layer 441NMc, and the upper enhancement magnetic layer 441UMc. Thus, in the method of forming the magnetic memory device in accordance with the embodiment, an electromagnetic characteristic between the lower pinned layer 420c and the second tunnel barrier layer 470c may be stably maintained even after a high temperature process. Therefore, in the method of forming the magnetic memory device in accordance with the embodiment, the annealing process of the substrate 100 may be free from a temperature constraint.

In the method of forming the magnetic memory device in accordance with the embodiment, the preliminary polarization enhancement layer 443a may be crystallized faster than the texture blocking layer 442c. For example, in the method of forming the magnetic memory device in accordance with the embodiment, an amorphous state of the texture blocking layer 442c may be maintained even after the preliminary polarization enhancement layer 443a is completely crystallized. Therefore, in the method of forming the magnetic memory device in accordance with the embodiment, a crystal structure of the polarization enhancement layer 443c may be affected only by the first tunnel barrier layer 450c.

Figure 22:
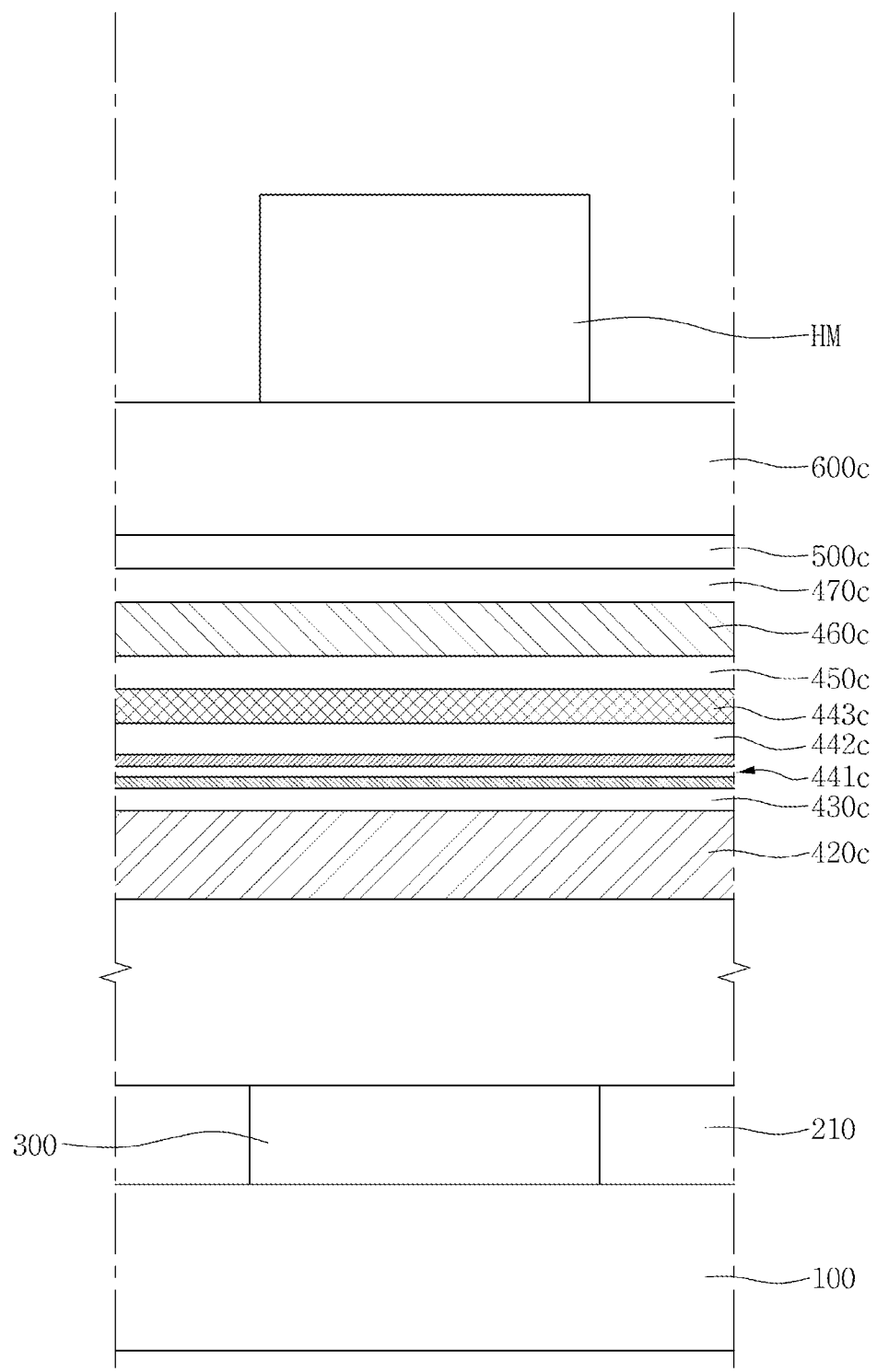

Referring to FIG. 22, the method of forming the magnetic memory device in accordance with the embodiment may include a process of forming a hard mask pattern HM on the metal mask layer 600c.

Figure 23:
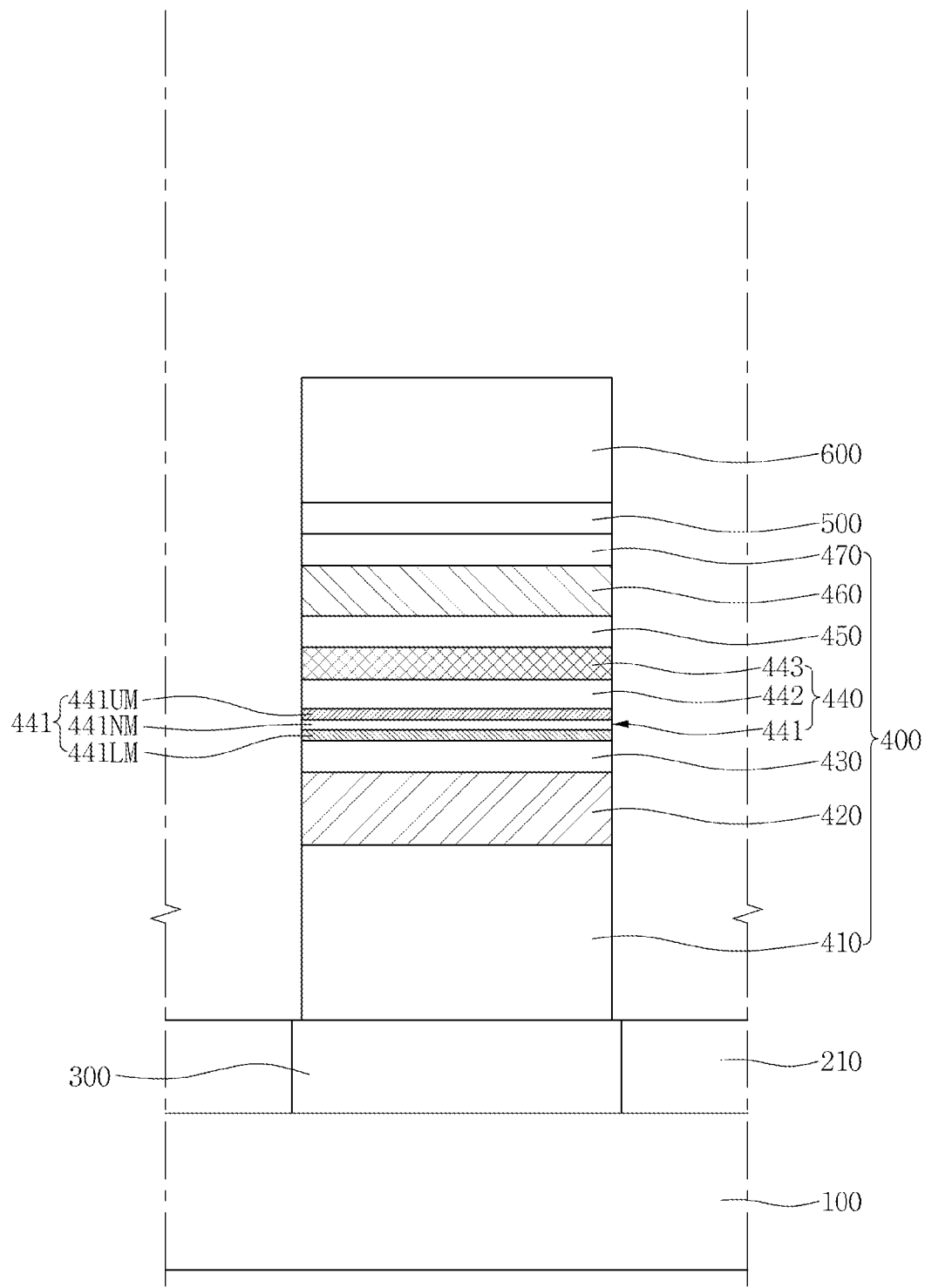

Referring to FIG. 23, the method of forming the magnetic memory device in accordance with the embodiment may include a process of forming a magnetic tunnel junction pattern 400, a capping pattern 500, and a metal pattern 600 on the lower plug 300, and removing the hard mask pattern HM.

The process of forming the magnetic tunnel junction pattern 400, the capping pattern 500, and the metal pattern 600 may include a process of forming the metal pattern 600, a process of forming the capping pattern 500, and a process of forming the magnetic tunnel junction pattern 400.

The process of forming the metal pattern 600 may include a process of etching the metal mask layer 600c using the hard mask pattern HM.

The process of forming of the capping pattern 500 may include a process of etching the capping layer 500c using the hard mask pattern HM. A side surface of the capping pattern 500 may be vertically aligned with a side surface of the metal pattern 600.

The process of forming the magnetic tunnel junction pattern 400 may include a process of etching the second tunnel barrier layer 470c, the free layer 460c, the first tunnel barrier layer 450c, the polarization enhancement layer 443c, the texture blocking layer 442c, the coupling enhancement layer 441c, the spacer layer 430c, the lower pinned layer 420c, and the seed layer 410c using the hard mask pattern HM. A side surface of the magnetic tunnel junction pattern 400 may be vertically aligned with the side surface of the capping pattern 500.

The magnetic tunnel junction pattern 400 may include a seed pattern 410, a lower pinned pattern 420, a spacer 430, an upper pinned pattern 440, a first tunnel barrier 450, a free pattern 460, and a second tunnel barrier 470. The upper pinned pattern 440 may include a coupling enhancement pattern 441, a texture blocking pattern 442, and a polarization enhancement pattern 443. The coupling enhancement pattern 441 may include a lower enhancement magnetic pattern 441LM, an enhancement non-magnetic pattern 441NM, and an upper enhancement magnetic pattern 441UM.

Figure 24:
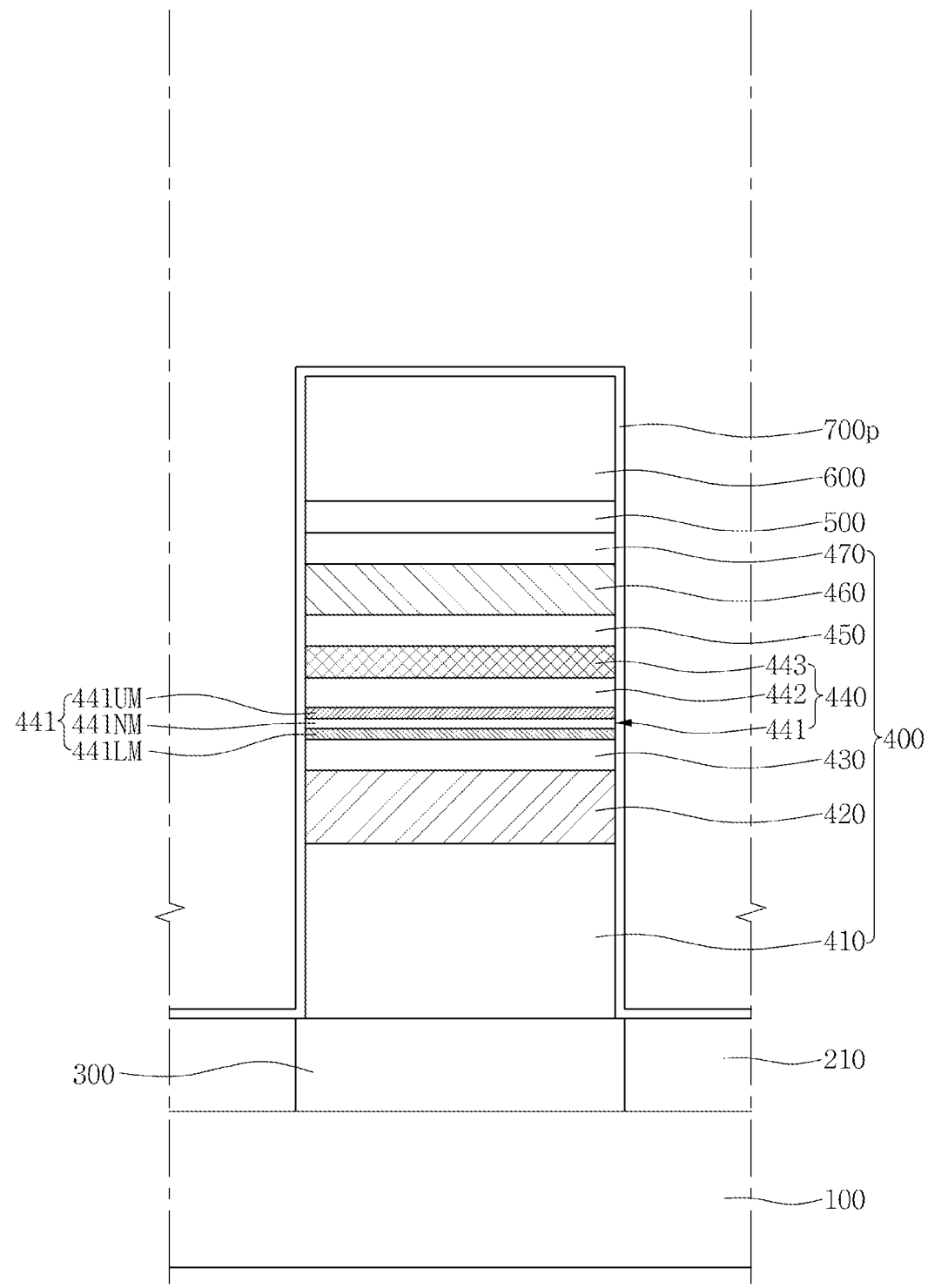

Referring to FIG. 24, the method of forming the magnetic memory device in accordance with the embodiment may include a process of forming an external insulating layer 700p on the magnetic tunnel junction pattern 400, the capping pattern 500, and the metal pattern 600.

The process of forming the external insulating layer 700p may include a process of depositing silicon nitride, silicon oxide, or a metal oxide on the magnetic tunnel junction pattern 400, the capping pattern 500, and the metal pattern 600.

Figure 25:
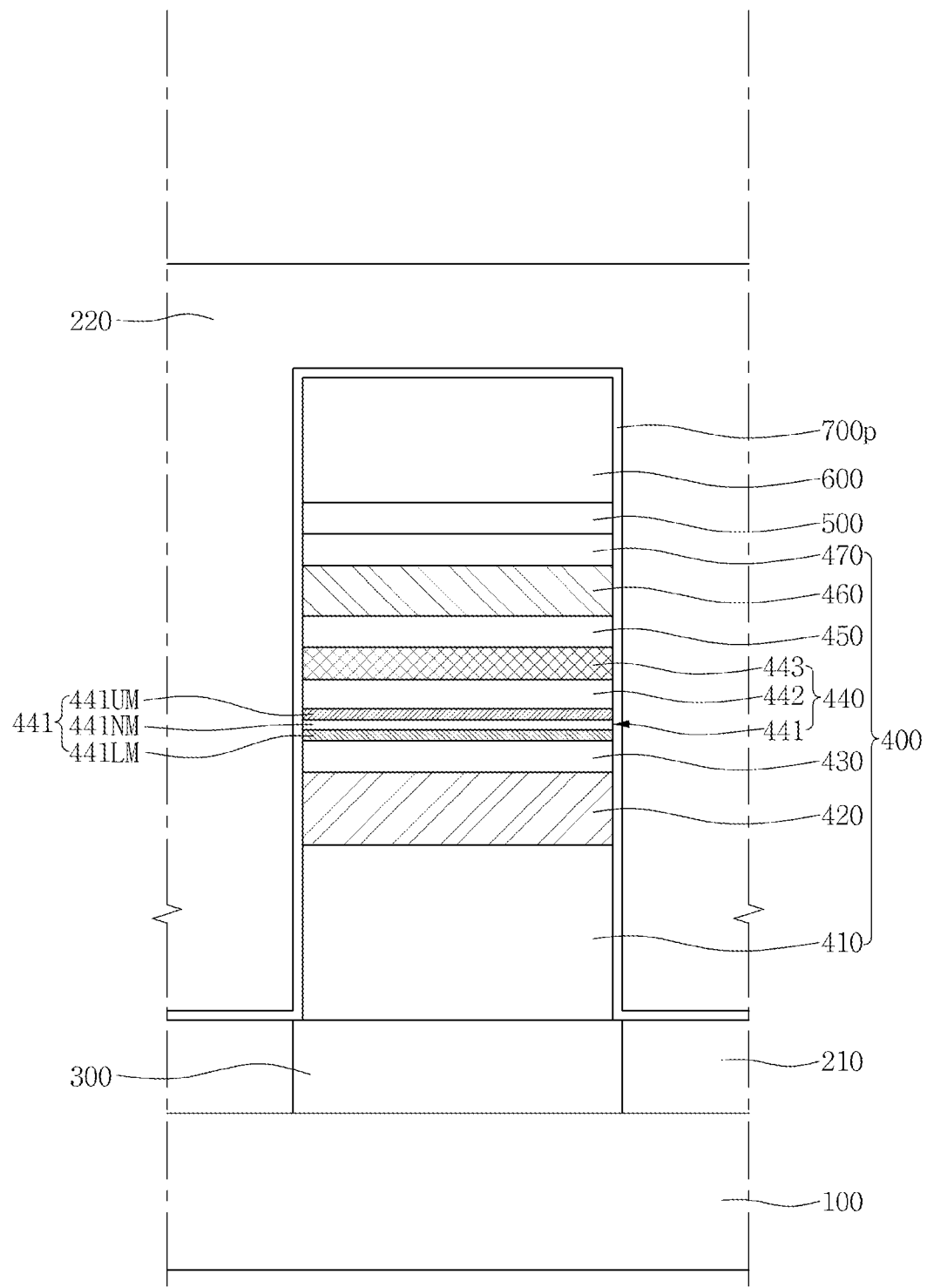

Referring to FIG. 25, the method of forming the magnetic memory device in accordance with the embodiment may include a process of forming an upper interlayer insulating layer 220 on the external insulating layer 700p.

The process of forming the upper interlayer insulating layer 220 may include a process of depositing silicon oxide or silicon nitride on the external insulating layer 700p. A level of an upper surface of the upper interlayer insulating layer 220 may be higher than that of an upper surface of the metal pattern 600.

Figure 26:
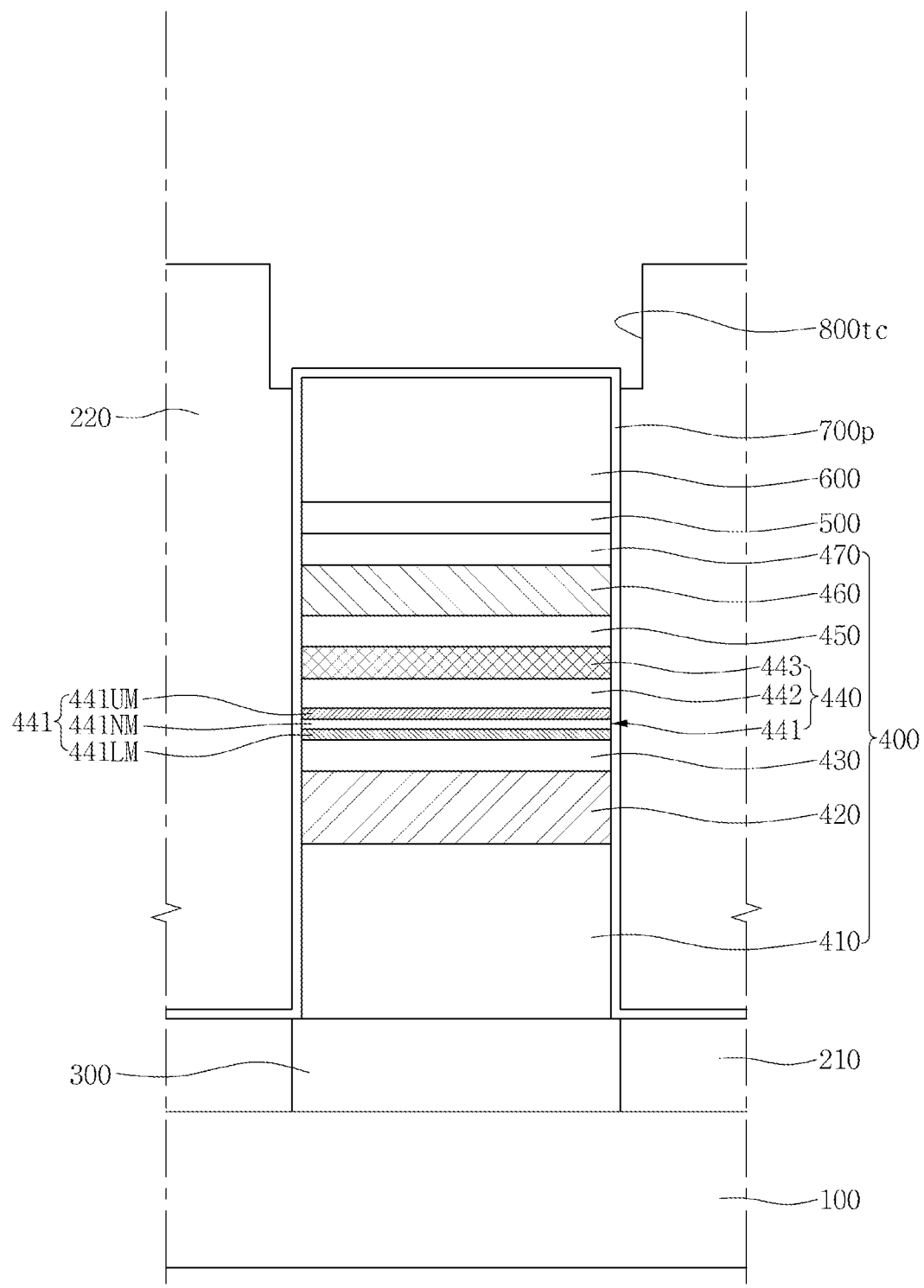

Referring to FIG. 26, the method of forming the magnetic memory device in accordance with the embodiment may include a process of forming an upper electrode contact hole 800tc in the upper interlayer insulating layer 220.

The process of forming the upper electrode contact hole 800tc may include a process of exposing the external insulating layer 700p located on the upper surface of the metal pattern 600. A horizontal width of the upper electrode contact hole 800tc may be greater than a horizontal width of the metal pattern 600. A level of a bottom of the upper electrode contact hole 800tc may be lower than a level of the upper surface of the metal pattern 600.

Figure 27:
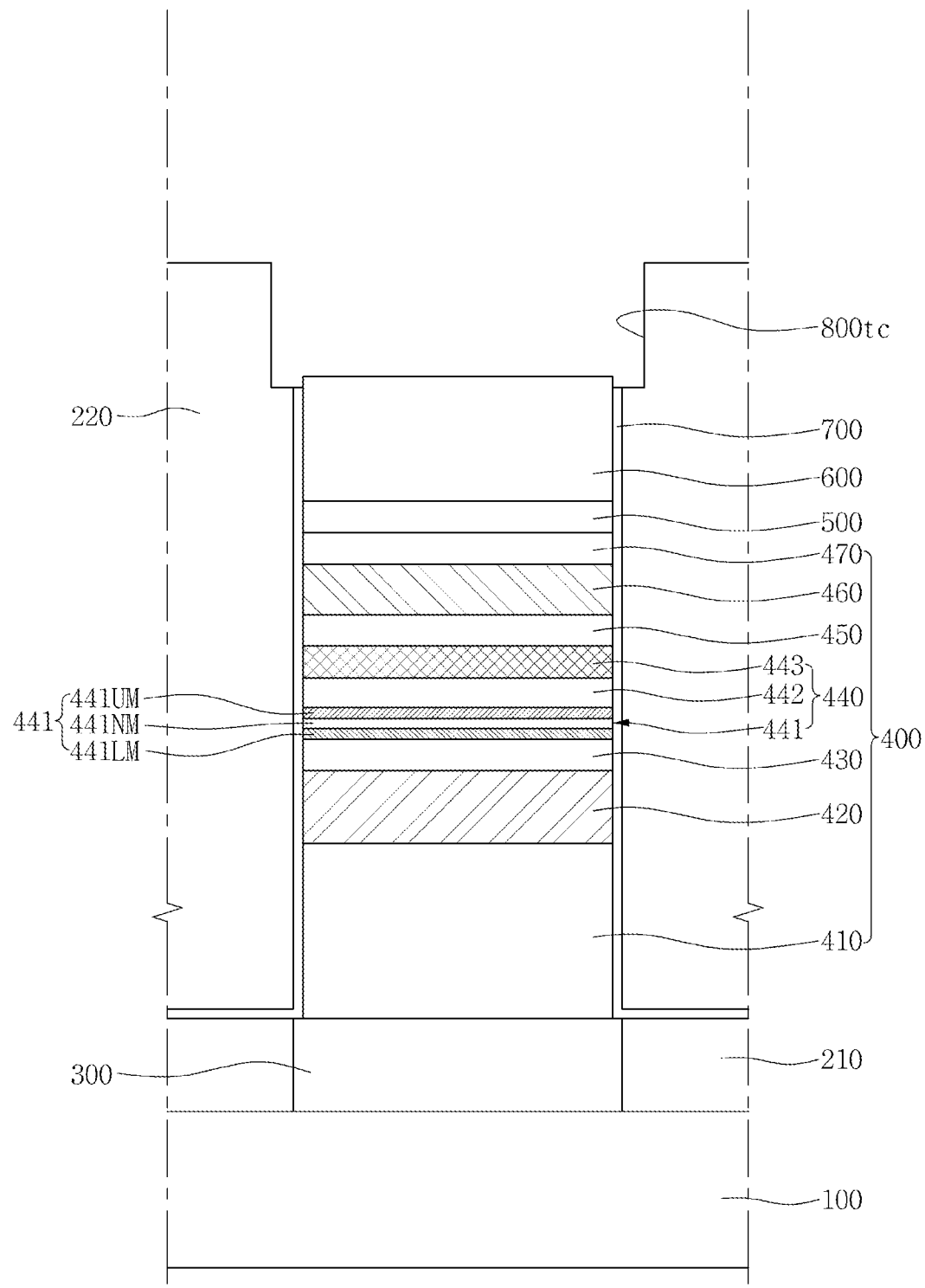

Referring to FIG. 27, the method of forming the magnetic memory device in accordance with the embodiment may include a process of forming a side insulating layer 700 on the substrate 100.

The process of forming the side insulating layer 700 may include a process of exposing the upper surface of the metal pattern 600. The process of exposing the upper surface of the metal pattern 600 may include a process of removing the external insulating layer 700p exposed by the upper electrode contact hole 800tc.

In the method of forming the magnetic memory device in accordance with the embodiment, it is described as the process of forming the upper electrode contact hole 800tc and the process of forming the side insulating layer 700 are sequentially performed. However, in the method of forming the magnetic memory device in accordance with the embodiment, the process of forming the side insulating layer 700 may be simultaneously performed with the process of forming the upper electrode contact hole 800*tc*. For example, in the method of forming the magnetic memory device in accordance with the embodiment, the external insulating layer 700*p* which covers the upper surface of the metal pattern 600 may be removed from the process of forming the upper electrode contact hole 800*tc*.

Figure 28:
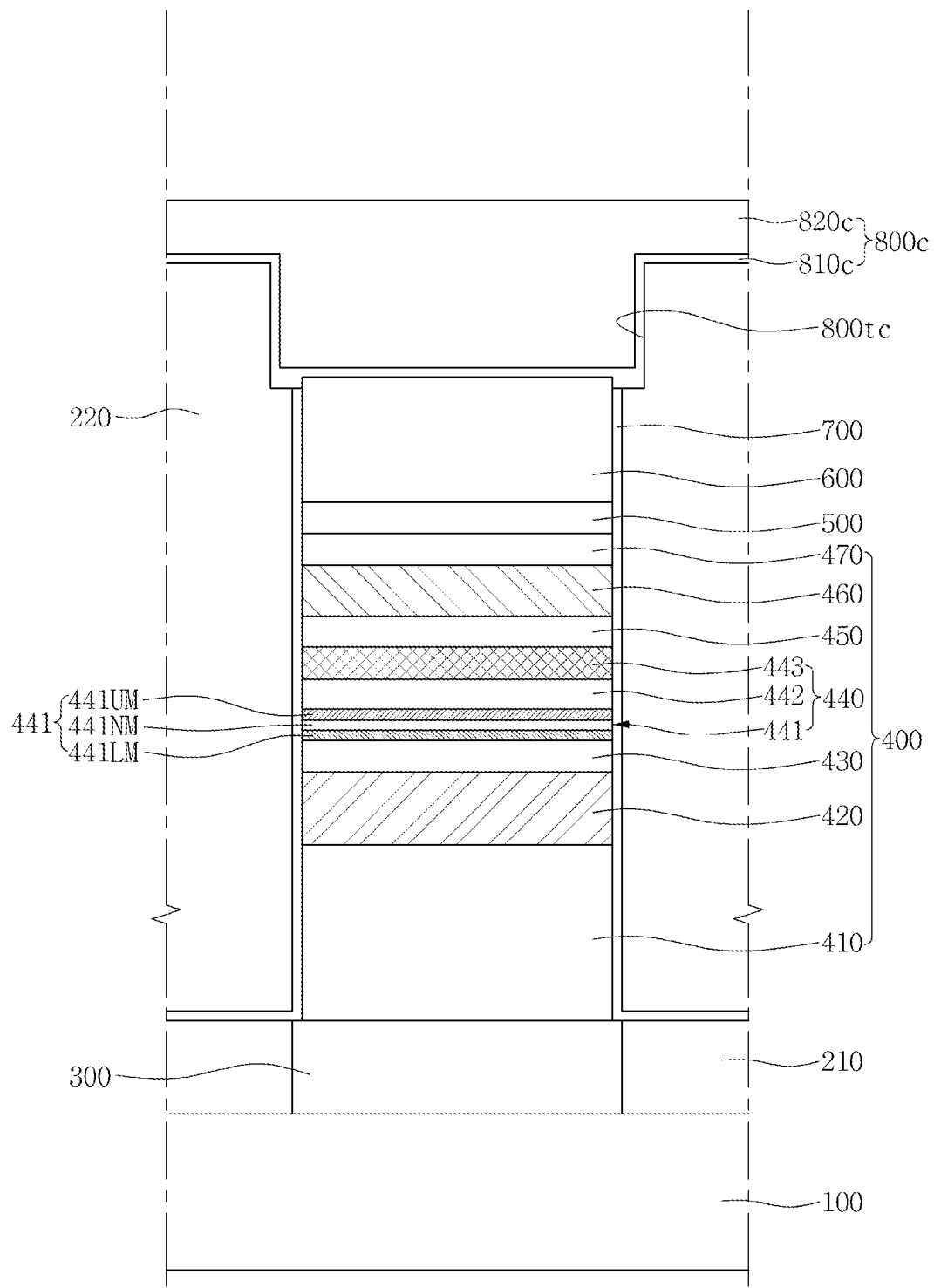

Referring to FIG. 28, the method of forming the magnetic memory device in accordance with the embodiment may include a process of forming an upper electrode layer 800*c* which fills the upper electrode contact hole 800*tc*.

The process of forming the upper electrode layer 800*c* may include a process of forming an electrode barrier layer 810*c* on the upper interlayer insulating layer 220 including the upper electrode contact hole 800*tc*, and a process of forming an upper conductive layer 820*c* which fills the upper electrode contact hole 800*tc* on the electrode barrier layer 810*c*.

Referring to FIG. 1, the method of forming the magnetic memory device in accordance with the embodiment may include a process of forming the upper electrode 800 on the metal pattern 600.

The process of forming the upper electrode 800 may include a process of patterning the electrode barrier layer 810*c* and the upper conductive layer 820*c*.

The method of forming the magnetic memory device in accordance with the embodiment may further include a curing process of the substrate 100 including the upper electrode 800. In the method of forming the magnetic memory device in accordance with the embodiment, since an electromagnetic characteristic of the magnetic tunnel junction pattern is stably maintained even after a high temperature process, the curing process of the substrate 100 may be free from a temperature constraint.

Further, the method of forming the magnetic memory device in accordance with the embodiment may further include a process of forming an electrode interconnection on the upper electrode 800. In the method of forming the magnetic memory device in accordance with the embodiment, since the electromagnetic characteristic of the magnetic tunnel junction pattern is stably maintained even after a high temperature process, the forming of the electrode interconnection may be free from a temperature constraint.

As a result, in the method of forming the magnetic memory device in accordance with the embodiment, the annealing process, the curing process, and the forming of the electrode interconnection may be free from temperature constraints. Therefore, in the method of forming the magnetic memory device in accordance with the embodiment, manufacturing efficiency and reliability of the device may be improved.

Figure 29:
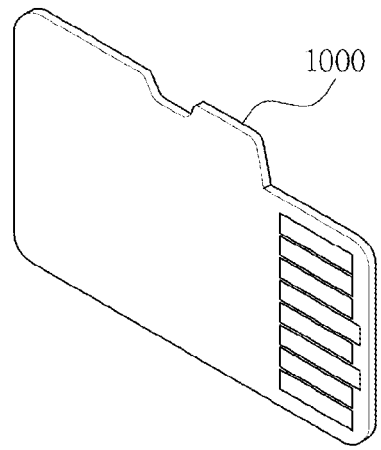
FIG. 29 is a schematic view showing a memory module including the magnetic memory device in accordance with the embodiments.

FIG. 29 is a schematic view showing a memory module including the magnetic memory device in accordance with the embodiments. Referring to FIG. 29, the memory module 1000 may be a memory card. For example, the memory module 1000 may be a micro SD card. The memory module 1000 may include the magnetic memory device in accordance with the embodiments. Thus, in the memory module 1000 in accordance with embodiments, reliability may be improved.

Figure 30:
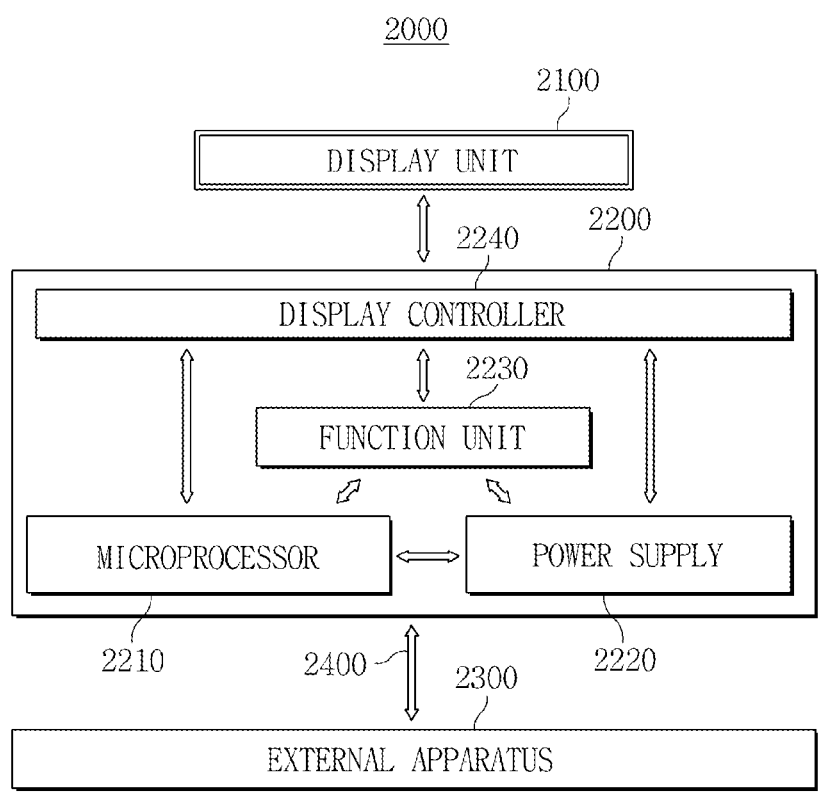
FIG. 30 is a schematic view showing a mobile system including the magnetic memory device in accordance with the embodiments.

FIG. 30 is a schematic view showing a mobile system including the magnetic memory device in accordance with the embodiments. Referring to FIG. 30, the mobile system 2000 may include a display unit 2100, a body unit 2200, and an external apparatus 2300. The body unit 2200 may include a microprocessor 2210, a power supply 2220, a function unit 2230, and a display controller 2240.

The display unit 2100 may be electrically connected to the body unit 2200. The display unit 2100 may be electrically connected to the display controller 2240 of the body unit 2200. The display unit 2100 may be configured to display an image processed by the display controller 2240 of the body unit 2200.

The body unit 2200 may include a system board or a motherboard having a printed circuit board (PCB). The microprocessor 2210, the power supply 2220, the function unit 2230, and the display controller 2240 may be mounted or disposed on the body unit 2200.

The microprocessor 2210 may be configured to receive a voltage from the power supply 2220 to control the function unit 2230 and the display controller 2240. The power supply 2220 may be configured to receive a constant voltage from an external power supply, divide the voltage into various voltage levels, and supply the voltages to the microprocessor 2210, the function unit 2230, the display controller 2240, etc.

The power supply 2220 may include a power management IC (PMIC). The PMIC may be configured to efficiently supply a voltage to the microprocessor 2210, the function unit 2230, the display controller 2240, etc.

The function unit 2230 may be configured to perform various functions of the mobile system 2000. For example, the function unit 2230 may include various components be configured to perform wireless communication functions such as video output to the display unit 2100 or voice output to a speaker through dialing or communication with the external apparatus 2300. For example, the function unit 2230 may be configured to serve as an image processor of a camera.

The function unit 2230, when the mobile system 2000 is connected to a memory card to expand the capacity, may be configured to serve as a memory card controller. The function unit 2230, when the mobile system 2000 further includes a Universal Serial Bus (USB) to expand the functions, may be configured to serve as an interface controller.

The microprocessor 2210, the power supply 2220, and the function unit 2230 may include the magnetic memory device in accordance with the embodiments. Therefore, in the mobile system 2000 in accordance with the embodiments, reliability may be improved.

Figure 31:
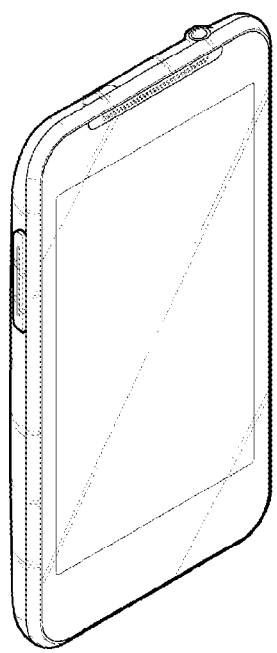
FIG. 31 is a schematic view showing a mobile device including the magnetic memory device in accordance with the embodiments.

FIG. 31 is a schematic view showing a mobile device including the magnetic memory device in accordance with the embodiments. Referring FIG. 31, for example, the mobile device 3000 may be a mobile wireless phone. For example, the mobile device 3000 may be a tablet PC. The mobile device 3000 may include the magnetic memory device in accordance with the embodiments. Therefore, in the mobile device 3000 in accordance with the embodiments, reliability may be improved.

Figure 32:
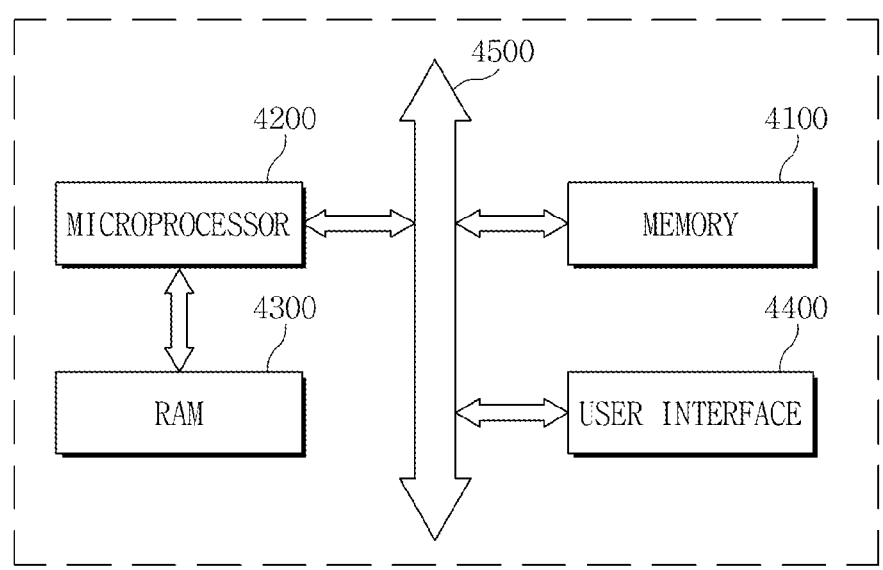
FIG. 32 is a schematic view showing an electronic system including the magnetic memory device in accordance with the embodiments.

FIG. 32 is a schematic view showing an electronic system including the magnetic memory device in accordance with the embodiments. Referring to FIG. 32, the electronic system 4000 may include a memory 4100, a microprocessor 4200, a random access memory (RAM) 4300, and a user interface 4400. The electronic system 4000 may be a system of a LED lighting device, a refrigerator, an air conditioner, an industrial cutter, a welding device, an automobile, a ship, an aircraft, a satellite, etc.

The memory 4100 may be configured to store codes for booting of the microprocessor 4200, data processed by the microprocessor 4200, or data received from the outside. The memory 4100 may include a controller and a memory.

The microprocessor 4200 may be configured to program and control the electronic system 4000. The RAM 4300 may be configured to be used as an operational memory of the microprocessor 4200.

The user interface 4400 may be configured to perform data communication using a bus 4500. The user interface 4400 may be used to input or output data to or from the electronic system 4000.

The memory 4100, the microprocessor 4200, and the RAM 4300 may include the magnetic memory device in accordance with the embodiments. Therefore, in the electronic system 4000 in accordance with the embodiments, reliability may be improved.

According to the magnetic memory device and the method of forming the same in accordance with the embodiment, an electromagnetic characteristic of a magnetic tunnel junction pattern cannot be degraded even after a high temperature process. Thus, in the magnetic memory device and the method of forming the same in accordance with the embodiment, a process can be selected without temperature constraints. Therefore, in the magnetic memory device and the method of forming the same in accordance with the embodiment, manufacturing efficiency and reliability of the device can be improved.

Embodiments include a magnetic memory device in which an electromagnetic characteristic of a magnetic tunnel junction pattern is not degraded even after a high temperature process, and a method of forming the same.

Embodiments are not limited to the above disclosure; other embodiments may become apparent to those of ordinary skill in the art based on the following descriptions.

In an embodiment, a magnetic memory device includes a pinned pattern including a coupling enhancement pattern, a polarization enhancement pattern, and a texture blocking pattern located between the coupling enhancement pattern and the polarization enhancement pattern, a free pattern located on the polarization enhancement pattern of the pinned pattern, and a tunnel barrier located between the pinned pattern and the free pattern. The coupling enhancement pattern includes a first enhancement magnetic pattern, a second enhancement magnetic pattern, and a first enhancement non-magnetic pattern located between the first enhancement magnetic pattern and the second enhancement magnetic pattern.

The second enhancement magnetic pattern may have the same crystal structure as the first enhancement magnetic pattern.

The first enhancement non-magnetic pattern may have the same crystal structure as the second enhancement magnetic pattern.

The second enhancement magnetic pattern may include the same material as the first enhancement magnetic pattern.

In another embodiment, a magnetic memory device includes a first pinned pattern, a free pattern located on the first pinned pattern, a spacer located between the first pinned pattern and the free pattern, a first tunnel barrier located between the spacer and the free pattern, a coupling enhancement pattern located between the spacer and the first tunnel barrier, a polarization enhancement pattern located between the coupling enhancement pattern and the first tunnel barrier, and a texture blocking pattern located between the coupling enhancement pattern and the polarization enhancement pattern. The coupling enhancement pattern includes at least two interfaces located between a magnetic material layer and a non-magnetic material layer.

The magnetic memory device may further include a capping pattern located on the free pattern and a second tunnel barrier located between the free pattern and the capping pattern. The second tunnel barrier may have the same crystal structure as the first tunnel barrier.

A crystallization temperature of the texture blocking pattern may be higher than that of the polarization enhancement pattern.

The texture blocking pattern may include blocking non-magnetic patterns and a blocking magnetic pattern located between the blocking non-magnetic patterns.

In another embodiment, a magnetic memory device includes a lower pinned pattern located on a substrate, a spacer located on the lower pinned pattern, wherein a crystal structure thereof is a hexagonal close-packed lattice (HCP) or a face centered cubic lattice (FCC), an upper pinned pattern located on the spacer, a tunnel barrier located on the upper pinned pattern, and a free pattern located on the tunnel barrier. The upper pinned pattern includes a coupling enhancement pattern located close to the spacer, a polarization enhancement pattern located close to the tunnel barrier, and a texture blocking pattern located between the coupling enhancement pattern and the polarization enhancement pattern. The coupling enhancement pattern includes enhancement magnetic patterns having a crystal structure which is a HCP or a FCC, and an enhancement non-magnetic pattern located between the enhancement magnetic patterns.

A crystal structure of the enhancement non-magnetic pattern is a HCP or a FCC.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A magnetic memory device, comprising:
   a pinned pattern including a coupling enhancement pattern, a polarization enhancement pattern, and a texture blocking pattern disposed between the coupling enhancement pattern and the polarization enhancement pattern;
   a free pattern disposed on the polarization enhancement pattern of the pinned pattern; and
   a tunnel barrier disposed between the pinned pattern and the free pattern,
   wherein the coupling enhancement pattern comprises a first enhancement magnetic pattern, a second enhancement magnetic pattern, and a first enhancement non-magnetic pattern disposed between the first enhancement magnetic pattern and the second enhancement magnetic pattern.

2. The device of claim 1, wherein the second enhancement magnetic pattern has substantially the same crystal structure as the first enhancement magnetic pattern.

3. The device of claim 1, wherein the second enhancement magnetic pattern comprises substantially the same material as the first enhancement magnetic pattern.

4. The device of claim 1, wherein the coupling enhancement pattern further comprises a second enhancement non-magnetic pattern disposed between the first enhancement non-magnetic pattern and the second enhancement magnetic pattern.

5. The device of claim 2, wherein the first enhancement non-magnetic pattern has substantially the same crystal structure as the second enhancement magnetic pattern.

6. The device of claim 4, wherein the second enhancement non-magnetic pattern has substantially the same crystal structure as the first enhancement non-magnetic pattern.

7. The device of claim 4, wherein the coupling enhancement pattern further comprises a third enhancement magnetic pattern disposed between the first enhancement non-magnetic pattern and the second enhancement non-magnetic pattern.

8. The device of claim 7, wherein the third enhancement magnetic pattern has substantially the same crystal structure as the first enhancement magnetic pattern.

9. A magnetic memory device, comprising:
a first pinned pattern;
a free pattern disposed on the first pinned pattern;
a spacer disposed between the first pinned pattern and the free pattern;
a first tunnel barrier disposed between the spacer and the free pattern;
a coupling enhancement pattern disposed between the spacer and the first tunnel barrier;
a polarization enhancement pattern disposed between the coupling enhancement pattern and the first tunnel barrier; and
a texture blocking pattern disposed between the coupling enhancement pattern and the polarization enhancement pattern,
wherein the coupling enhancement pattern comprises at least two interfaces disposed between a magnetic material layer and a non-magnetic material layer.

10. The device of claim 9, wherein the coupling enhancement pattern comprises:
a first enhancement magnetic pattern contacting the spacer; and
a second enhancement magnetic pattern contacting the texture blocking pattern,
wherein the first enhancement magnetic pattern and the second enhancement magnetic pattern comprise a magnetic material.

11. The device of claim 9, further comprising:
a capping pattern disposed on the free pattern; and
a second tunnel barrier disposed between the free pattern and the capping pattern,
wherein the second tunnel barrier has substantially the same crystal structure as the first tunnel barrier.

12. The device of claim 9, wherein a crystallization temperature of the texture blocking pattern is higher than a crystallization temperature of the polarization enhancement pattern.

13. The device of claim 11, wherein the second tunnel barrier comprises substantially the same material as the first tunnel barrier.

14. The device of claim 12, wherein the texture blocking pattern comprises blocking non-magnetic patterns and a blocking magnetic pattern disposed between the blocking non-magnetic patterns.

15. The device of claim 14, wherein the blocking magnetic pattern is amorphous.

16. A magnetic memory device, comprising:
a pinned pattern including a plurality of patterns;
a tunnel barrier pattern disposed on the pinned pattern; and
a free pattern disposed on the pinned pattern;
wherein:
each of at least two interfaces between the patterns of the pinned pattern comprises a magnetic material to non-magnetic material interface;
the patterns of the pinned pattern comprise first and second magnetic patterns and a non-magnetic pattern; and
the at least two interfaces include a first interface between the first magnetic pattern and the non-magnetic pattern and a second interface between the second magnetic pattern and the non-magnetic pattern.

17. The device of claim 16, wherein:
the non-magnetic pattern is referred to as a first non-magnetic pattern;
the patterns of the pinned pattern further comprise a second non-magnetic pattern; and
the at least two interfaces further include a third interface between the second magnetic pattern and the second non-magnetic pattern.

18. The device of claim 16, wherein:
the at least two interfaces between the patterns of the pinned pattern comprises at least four interfaces; and
each of the at least four interfaces comprises a magnetic material to non-magnetic material interface.

19. The device of claim 16, wherein:
the at least two interfaces between the patterns of the pinned pattern comprises at least five interfaces; and
each of the at least five interfaces comprises a magnetic material to non-magnetic material interface.

* * * * *